US012575098B2

(12) United States Patent
Cao

(10) Patent No.: US 12,575,098 B2
(45) Date of Patent: Mar. 10, 2026

(54) STORAGE CELL, STORAGE BLOCK, AND MEMORY

(71) Applicant: WUHAN XINXIN SEMICONDUCTOR MANUFACTURING CO., LTD., Wuhan (CN)

(72) Inventor: Kaiwei Cao, Wuhan (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 600 days.

(21) Appl. No.: 18/068,504

(22) Filed: Dec. 19, 2022

(65) Prior Publication Data

US 2024/0172430 A1 May 23, 2024

(30) Foreign Application Priority Data

Nov. 18, 2022 (CN) .......................... 202211453745.4

(51) Int. Cl.
*H10B 41/27* (2023.01)
*G11C 16/14* (2006.01)
*H10B 41/10* (2023.01)
*H10B 43/10* (2023.01)
*H10B 43/27* (2023.01)

(52) U.S. Cl.
CPC ............. *H10B 41/27* (2023.02); *G11C 16/14* (2013.01); *H10B 41/10* (2023.02); *H10B 43/10* (2023.02); *H10B 43/27* (2023.02)

(58) Field of Classification Search
CPC ........ H10B 41/27; H10B 41/10; H10B 43/10; H10B 43/27; G11C 16/14
See application file for complete search history.

(56) References Cited

U.S. PATENT DOCUMENTS

2008/0029805 A1 2/2008 Shimamoto et al.
2008/0173933 A1 7/2008 Fukuzumi et al.
2017/0040416 A1* 2/2017 Ota .................... G11C 16/0483
2020/0211627 A1 7/2020 Atsumi et al.

OTHER PUBLICATIONS

Taiwan First Notice of examination opinions, Application No. 112140009, mailed Aug. 19, 2024 (9 pages).

* cited by examiner

*Primary Examiner* — Marlon T Fletcher
*Assistant Examiner* — Samuel Jonathan Smith

(57) ABSTRACT
The present disclosure discloses a storage cell, a storage block and a memory. The storage cell includes a semiconductor assembly, a controlling gate, and at least one base electrode. The semiconductor assembly includes a source-region semiconductor, a drain-region semiconductor and a channel semiconductor. The channel semiconductor is arranged between the source-region semiconductor and the drain-region semiconductor, and is arranged side by side with the source-region semiconductor and the drain-region semiconductor. The controlling gate is arranged at one side of the semiconductor assembly, and corresponds to the channel semiconductor. The at least one base electrode is electrically connected to the other side of at least one of the source-region semiconductor and the drain-region semiconductor, corresponds to the at least one of the source-region semiconductor and the drain-region semiconductor, and is configured to be applied a base voltage.

13 Claims, 8 Drawing Sheets

Storage device 200

Stotage block 100

120a(120)
120b(120)
120c(120)

110a(110)
110b(110)

1215   1211   1214   1211   1215   121   121

Y
Z
X 141-3(141)
141-2(141)
141-1(141)
142-1(142)
142-2(142)
144-3(144)
144-2(144)
144-1(144)

143-1(143)   143-2(143)   111-1(111)   111-2(111)
111-3(111)

Z
Y
X

STORAGE CELL, STORAGE BLOCK, AND MEMORY

CROSS REFERENCE TO RELATED APPLICATIONS

The present application claims priority to Chinese Patent Application NO. 202211453745.4 filed on Nov. 18, 2022, the entire contents of which are herein incorporated by reference in their entireties.

TECHNICAL FIELD

The present disclosure relates to the technical field of semiconductor devices, in particular to a storage cell, a storage block, and a memory.

BACKGROUND

Two-dimensional (2D) storage block is ubiquitous in electronic devices, and may include NOR flash storage array, NAND flash storage array, dynamic random-access memory (DRAM) array, and so on. However, 2D storage array has already approached a scaling limit, and a storage density cannot be further improved.

SUMMARY

Firstly, the present disclosure provides a storage block. The storage block, includes a storage array. The storage array includes a plurality of stacking strip structures and a plurality of semiconductor-structure pairs. The stacking strip structures are spaced apart from each other along a column direction. Each of the stacking strip structures extends along a row direction, and includes a plurality of insulative strips and a plurality of conductive strips alternately stacked along a height direction. Several of the semiconductor-structure pairs are arranged between every two of the stacking strip structures adjacent to each other. The every two of the stacking strip structures adjacent to each other and the several of the semiconductor-structure pairs arranged therebetween are involved in forming a row storage subarray. The conductive strips in the every two of the stacking strip structures adjacent to each other serve as controlling gates of the row storage subarray. The row storage subarray includes a plurality of storage-cell groups distributed along the row direction. Each of the storage-cell groups includes a corresponding one of the semiconductor-structure pairs and a base-electrode structure. Each of the semiconductor-structure pairs includes two semiconductor structures arranged side by side and spaced apart from each other in the column direction. The base-electrode structure is arranged between the two semiconductor structures. The two semiconductor structures and the base-electrode structure extend along the height direction respectively.

Secondly, the present disclosure provides a storage cell. The storage cell includes a semiconductor assembly, a controlling gate, and at least one base electrode. The semiconductor assembly includes a source-region semiconductor, a drain-region semiconductor, and a channel semiconductor. The channel semiconductor is arranged between the source-region semiconductor and the drain-region semiconductor, and arranged side by side with the source-region semiconductor and the drain-region semiconductor. The controlling gate is arranged at one side of the semiconductor assembly. The controlling gate corresponds to the channel semiconductor. The at least one base electrode is electrically connected to the other side of at least one of the source-region semiconductor and the drain-region semiconductor. The at least one base electrode corresponds to the at least one of the source-region semiconductor and the drain-region semiconductor, and is configured to be applied a base voltage.

Thirdly, the present disclosure provides a memory. The memory includes a storage-cell group and an insulative dielectric layer. The storage-cell group includes a source end, a drain end, a source connecting column connected to the source end in a height direction, and a drain connecting column connected to the drain end in the height direction. The insulative dielectric layer is arranged at a side of the storage-cell group in the height direction. A drain controlling strip is arranged in the insulative dielectric layer. The drain connecting column and the source connecting column pass through the insulative dielectric layer and the drain controlling strip respectively. An insulative material in the insulative dielectric layer is arranged between the drain connecting column and the drain controlling strip, and between the source connecting column and the drain controlling strip. In a direction perpendicular to the height direction, a thickness of the insulative material between the drain connecting column and the drain controlling strip is less than a thickness of the insulative material between the source connecting column and the drain controlling strip.

BRIEF DESCRIPTION OF THE DRAWINGS

In order to explain technical solutions of embodiments of the present disclosure more clearly, the following will briefly introduce figures needed to use in the description of the embodiments. Obviously, the figures in the following are only some embodiments of the present disclosure. For those skilled in the art, other figures may also be obtained from these figures.

DETAILED DESCRIPTION

Technical solutions in embodiments of the present disclosure will be described clearly and completely in combination with figures in the embodiments of the present disclosure. It is understood that the specific embodiments described herein are only used to explain the present disclosure, but not to limit the present disclosure. In addition, it should be noted that, for the convenience of description, only a part of structures which related to the present disclosure are shown in the figures, but not all structures. Based on the embodiments in the present disclosure, all other embodiments obtained by those skilled in the art without doing any creative work belong to the protection scope of the present disclosure.

Figure 1:
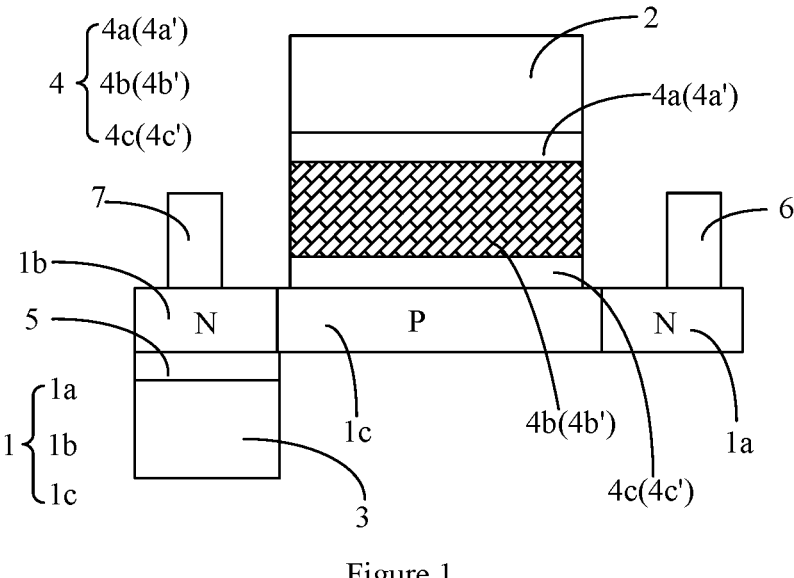
FIG. 1 is a schematic structure view of a storage cell according to an embodiment of the present disclosure.

As shown in FIG. 1, FIG. 1 is a schematic structure view of a storage cell according to an embodiment of the present disclosure. The storage cell includes a semiconductor assembly 1, a controlling gate 2, and at least one base electrode 3. The semiconductor assembly 1 includes a source-region semiconductor 1a, a drain-region semiconductor 1b, and a channel semiconductor 1c. The channel semiconductor 1c is arranged between the source-region semiconductor 1a and the drain-region semiconductor 1b, and is arranged side by side with the source-region semiconductor 1a and the drain-region semiconductor 1b. The controlling gate 2 is arranged at one side of the semiconductor assembly 1, and corresponds to the channel semiconductor 1c. The at least one base electrode 3 is electrically connected to the other side of at least one of the source-region semiconductor 1a and the drain-region semiconductor 1b, corresponds to the at least one of the source-region semiconductor 1a and the drain-region semiconductor 1b, and is configured to be applied a base voltage.

In some embodiments, the source-region semiconductor 1a, the drain-region semiconductor 1b, and the channel semiconductor 1c may be polycrystalline silicon. The source-region semiconductor 1a and the drain-region semiconductor 1b may be a first doping type, and the channel semiconductor 1c may be a second doping type. In some embodiments, the source-region semiconductor 1a and the drain-region semiconductor 1b may be N-type doped polycrystalline silicon, and the channel semiconductor 1c may be P-type doped polycrystalline silicon. The channel semiconductor 1c may be partially depleted or fully depleted.

In some embodiments, the source-region semiconductor 1a and the drain-region semiconductor 1b may be the P-type doped polycrystalline silicon, and the channel semiconductor 1c may be the N-type doped polycrystalline silicon. In some embodiments, the source-region semiconductor 1a, the drain-region semiconductor 1b, and the channel semiconductor 1c may also be monocrystalline silicon, which is not limited in the present disclosure, and those skilled in the art may make choices according to actual situations.

The controlling gate 2 may be metals (such as copper, aluminum, tungsten, or an alloy thereof) or semiconductor materials (such as polycrystalline silicon/germanium, or other suitable materials). The base electrode 3 may be metals, such as copper, aluminum, tungsten, or an alloy thereof. As shown in FIG. 1, in some embodiments, the number of the at least one base electrode 3 may be one. The base electrode 3 is corresponding to the drain-region semiconductor 1b, and is configured to be applied the base voltage. In this case, the storage cell is a four-terminal storage cell (the four terminals include a source 6 connected to the one side of the source-region semiconductor 1a, a drain 7 connected to the one side of the drain-region semiconductor 1b, the controlling gate 2, and the base electrode 3). In response to the base electrode 3 being applied the base voltage, at least part of the drain-region semiconductor 1b may be inverted. For example, at least part of the drain-region semiconductor 1b may be inverted from the N-type to the P-type, or from the P-type to the N-type.

In some embodiments, the number of the at least one base electrode 3 may be one. The base electrode 3 is corresponding to the source-region semiconductor 1a, and is configured to be applied the base voltage. In this case, the storage cell is a four-terminal storage cell (the four terminals include the source 6 connected to the one side of the source-region semiconductor 1a, the drain 7 connected to the one side of the drain-region semiconductor 1b, the controlling gate 2, and the base electrode 3). In response to the base electrode 3 being applied the base voltage, at least part of the drain-region semiconductor 1b may be inverted. For example, at least part of the drain-region semiconductor 1b may be inverted from the N-type to the P-type, or from the P-type to the N-type.

In some embodiments, the number of the at least one base electrode 3 may be two. One of the two base electrodes 3 is corresponding to the drain-region semiconductor 1b, and the other of the two base electrodes 3 is corresponding to the source-region semiconductor 1a. In this case, the storage cell is a five-terminal storage cell (the five terminals include the source 6 connected to the one side of the source-region semiconductor 1a, the drain 7 connected to the one side of the drain-region semiconductor 1b, the controlling gate 2, and the two base electrodes 3), which is not limited in the present disclosure, and those skilled in the art may make choices according to actual needs.

In the related art, the source region and the drain region are usually formed on a substrate/well region by doping, and it is difficult to realize a three-dimensional stacking. In the present disclosure, the source-region semiconductor 1a, the drain-region semiconductor 1b, and the channel semiconductor 1c are arranged side by side. The controlling gate 2 is arranged at the one side of the semiconductor assembly 1, and corresponds to the channel semiconductor 1c. The at least one base electrode 3 is electrically connected to the other side of at least one of the source-region semiconductor 1a and the drain-region semiconductor 1b, corresponds to the at least one of the source-region semiconductor 1a and the drain-region semiconductor 1b, and is configured to be applied the base voltage. Each of the at least one base electrode 3 may correspond to one of the source-region semiconductor 1a and the drain-region semiconductor 1b in one-to-one correspondences. In this way, a four/five-terminal storage cell is provided. Compared with the related art, the difficulty of a 3D stacking is reduced, and a storage density is improved.

Furthermore, as shown in FIG. 1, the storage cell may further include a storage assembly 4 arranged between the controlling gate 2 and the semiconductor assembly 1, and an interlayer dielectric 5 arranged between the base electrode 3 and the drain-region semiconductor 1*b*. It should be noted that, in case that the number of the at least one base electrode 3 is one, and the base electrode 3 is corresponding to the source-region semiconductor 1*a*, the interlayer dielectric 5 may be arranged between the base electrode 3 and the source-region semiconductor 1*a*. In case that the number of the at least one base electrode 3 is two, one of the two base electrodes 3 is corresponding to drain-region semiconductor 1*b*, and the other of the two base electrodes 3 is corresponding to source-region semiconductor 1*a*, the interlayer dielectric 5 may be arranged between the base electrode 3 and the drain-region semiconductor 1*b*, and between the base electrode 3 and the source-region semiconductor 1*a*.

In some embodiments, the storage assembly 4 may be a floating-gate storage assembly. The floating-gate storage assembly includes a first dielectric layer 4*a*, a floating gate 4*b*, and a second dielectric layer 4*c*. The first dielectric layer 4*a* is arranged between the floating gate 4*b* and the controlling gate 2. The floating gate 4*b* is arranged between the first dielectric layer 4*a* and the second dielectric layer 4*c*. The second dielectric layer 4*c* is arranged between the floating gate 4*b* and the semiconductor assembly 1. That is to say, the first dielectric layer 4*a*, the floating gate 4*b*, and the second dielectric layer 4*c* are sequentially stacked.

The floating gate 4*b* may be doped polycrystalline silicon, and the first dielectric layer 4*a* and second dielectric layer 4*c* may be dielectric materials, such as silicon oxide, silicon nitride, silicon oxynitride, etc. The present disclosure does not limit the materials of the first dielectric layer 4*a*, the floating gate 4*b*, and the second dielectric layer 4*c*, and those skilled in the art may make choices according to actual needs.

In some embodiments, the storage assembly 4 may be a charge-trapping storage assembly. The charge-trapping storage assembly includes a first dielectric layer 4*a*', a charge-storage layer 4*b*' and a second dielectric layer 4*c*'. The first dielectric layer 4*a*' is arranged between the charge-storage layer 4*b*' and the controlling gate 2. The charge-storage layer 4*b*' is arranged between the first dielectric layer 4*a*' and the second dielectric layer 4*c*'. The second dielectric layer 4*c*' is arranged between the charge-storage layer 4*b*' and the semiconductor assembly 1. That is to say, the first dielectric layer 4*a*', the charge-storage layer 4*b*', and the second dielectric layer 4*c* 'are sequentially stacked.

The charge-storage layer 4*b*' may be storage materials with charge-trapping characteristics, such as silicon nitride. The first dielectric layer 4*a*' and the second dielectric layer 4*c*' may be dielectric materials, such as silicon oxide, silicon oxynitride, etc. The present disclosure does not limit the materials of the first dielectric layer 4*a*', the charge-storage layer 4*b*', and the second dielectric layer 4*c*', and those skilled in the art may make choices according to actual needs.

In some embodiments, the storage assembly 4 may also be other types of capacitive dielectric structures, which is not limited in the present disclosure, and those skilled in the art may make choices according to actual needs.

Figure 2:
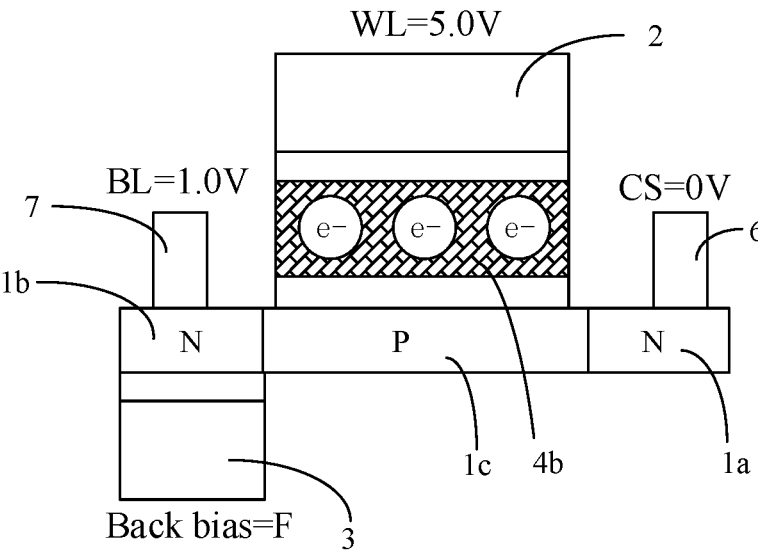
FIG. 2 is a schematic view of the storage cell shown in FIG. 1 in case that a reading operation is executed on the storage cell.
Figure 3:
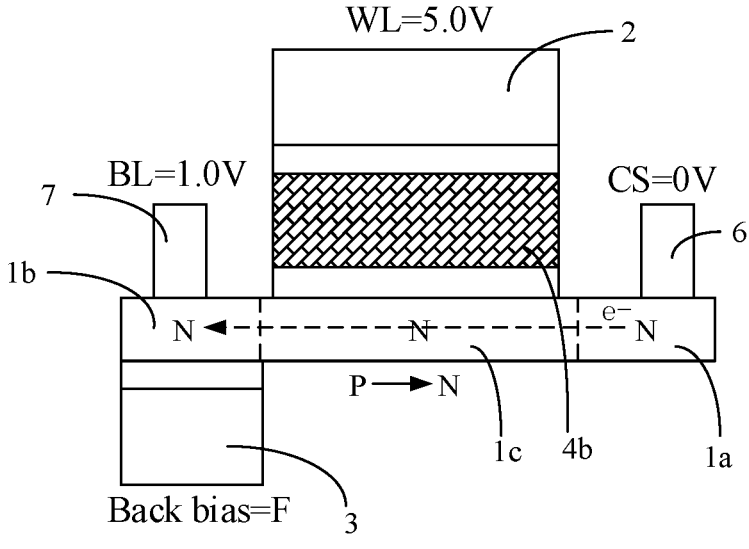
FIG. 3 is a further schematic view of the storage cell shown in FIG. 1 in case that the reading operation is executed on the storage cell.
Figure 4:
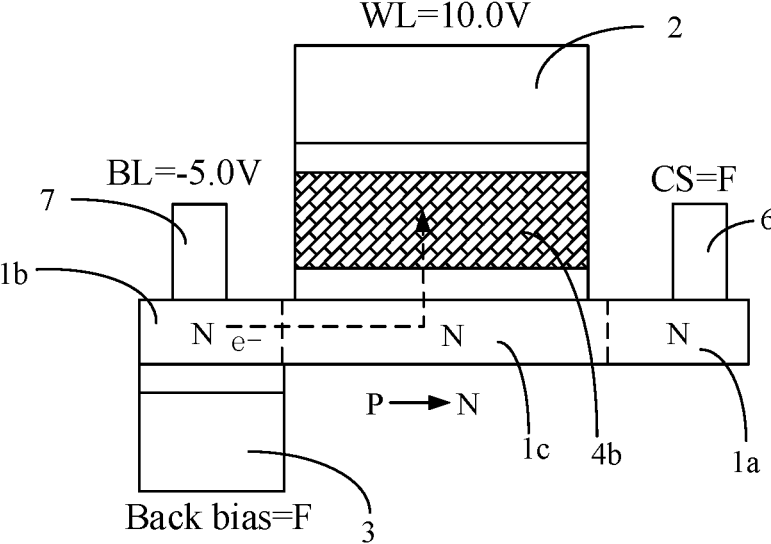
FIG. 4 is a schematic view of the storage cell shown in FIG. 1 in case that a programming operation is executed on the storage cell.
Figures 5, 6:
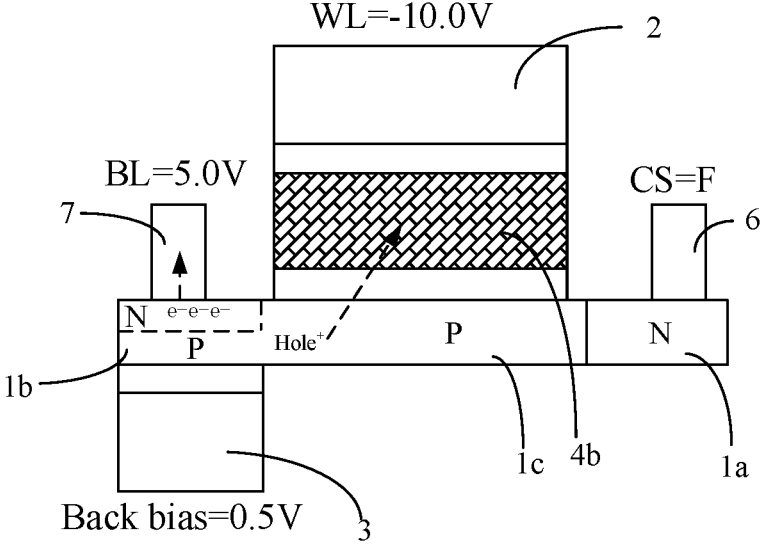
FIG. 5 is a schematic view of the storage cell shown in FIG. 1 in case that an erasing operation is executed on the storage cell.
FIG. 6 is a block diagram of a storage device according to an embodiment of the present disclosure.

Specific structure of the storage cell is described in detail above. Operating principles of the storage cell will be described in combination with FIGS. 2 to 5 in the following. FIG. 2 is a schematic view of the storage cell shown in FIG. 1 in case that a reading operation is executed on the storage cell. FIG. 3 is a further schematic view of the storage cell shown in FIG. 1 in case that the reading operation is executed on the storage cell. FIG. 4 is a schematic view of the storage cell shown in FIG. 1 in case that a programming operation is executed on the storage cell. FIG. 5 is a schematic view of the storage cell shown in FIG. 1 in case that an erasing operation is executed on the storage cell.

As shown in FIGS. 2 and 3, in response to the programming operation being executed on the storage cell, a first word-line voltage (such as 5V) may be applied to the controlling gate 2, a first bit-line voltage (such as 1V) may be applied to the drain 7, a first source voltage (such as 0V) may be applied to the source 6, and the base electrode 3 may be floating.

As shown in FIG. 2, in case that electrons are stored in the floating gate 4*b* of the storage cell, a threshold voltage of the storage cell rises. The controlling gate 2 receives the first word-line voltage of 5V. In this case, the first word-line voltage is not enough to conduct the storage cell, that is, no conductive channel exists between the source-region semiconductor 1*a* and the drain-region semiconductor 1*b*. Therefore, no current is generated between the source-region semiconductor 1*a* and the drain-region semiconductor 1*b*, and "0" is read. As shown in FIG. 3, in case that no electron is stored in the floating gate 4*b* of the storage cell, the controlling gate 2 receives the first word-line voltage of 5V, the first word-line voltage is enough to conduct the storage cell, that is, the conductive channel exists between the source-region semiconductor 1*a* and the drain-region semiconductor 1*b*. Therefore, the current is generated between the source-region semiconductor 1*a* and the drain-region semiconductor 1*b*, and "1" is read.

As shown in FIG. 4, in response to the programming operation being executed on the storage cell, a second word-line voltage (such as, 10V) may be applied to the controlling gate 2, a second bit-line voltage (such as, −5V) may be applied to the drain 7, and the source 6 and the base electrode 3 may be floating. The electrons flow from the drain-region semiconductor 1*b* to the source-region semiconductor 1*a*. In a process of the electrons flowing from the drain-region semiconductor 1*b* to the source-region semiconductor 1*a*, the electrons need to pass through under the controlling gate 2. Due to a strong positive electric field applied on the controlling gate 2, some electrons are "pulled" into the floating gate 4*b* of the storage cell. Once pulled in, the electrons will no longer have the energy required to escape. In this way, data is programmed in the storage cell, that is, the data is programmed in the storage cell by hot carrier injection.

As shown in FIG. 5, in response to the erasing operation being executed on the storage cell, a third word-line voltage (such as, −10V) may be applied to the controlling gate 2, a third bit-line voltage (such as, 5V) may be applied to the drain 7, the base voltage (such as, 0.5V) may be applied to the base electrode 3, and the source 6 may be floating. Since the base voltage of 0.5V is lower than the third bit-line voltage of 5V, at least part of the drain-region semiconductor 1*b* close to the base electrode 3 is inverted to the P type. At least another part of the drain-region semiconductor 1*b* far away from the base electrode 3 is still maintained as the N type, thereby forming a PN junction. Band-to-band tunneling will occur at the PN junction, such that electrons and holes are generated. The electrons flow away from the drain 7, and the holes enter the floating gate 4*b* under the effect of a high electric field. That is, the erasing operation is realized by hot hole injection. It should be noted that, in response to the erasing operation being executed on the storage cell, the base voltage applied to the base electrode 3 needs to be lower than the third bit-line voltage, and much higher than the third word-line voltage.

The present disclosure further provides a storage block and a storage device (chip) formed by stacking the above storage cell in a three-dimensional space. As shown in FIG. 6, FIG. 6 is a block diagram of a storage device according to an embodiment of the present disclosure. The storage device 200 may be a non-volatile memory. The storage device 200 may include one or more storage blocks 100.

Figure 7:
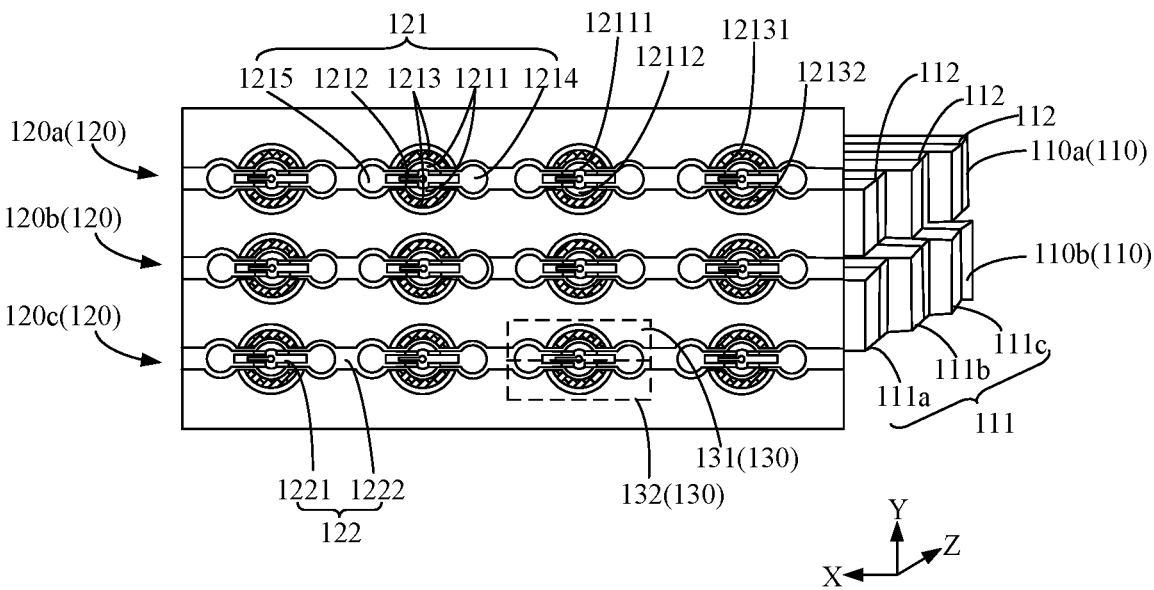
FIG. 7 is a schematic partial-structure view of a storage block according to an embodiment of the present disclosure.

As shown in FIG. 7, FIG. 7 is a schematic partial-structure view of a storage block according to an embodiment of the present disclosure. The storage block 100 may include a storage array (the storage array includes a plurality of row storage subarrays, as shown in FIGS. 7, 120a, 120b, and 120c respectively represent one row storage subarray) and various types of connecting lines (such as source lines 141, bit lines 142, base-electrode lines 143, and so on shown in FIG. 16).

The storage array includes a plurality of stacking strip structures 110 spaced apart from each other along a column direction (for example, a Y direction shown in FIG. 7). As shown in FIGS. 7, 110a and 110b respectively represent one stacking strip structure 110. Each stacking strip structure 110 extends in a row direction (for example, a X direction shown in FIG. 7). Each stacking strip structure 110 includes a plurality of conductive strips 111 and a plurality of insulative strips 112 alternately stacked along a height direction (for example, a Z direction shown in FIG. 7). The conductive strip 111 and the insulative strip 112 may be alternately arranged one by one. As shown in FIGS. 7, 111a, 111b and 111c respectively represent one conductive strip 111. The column direction, the row direction and the height direction are perpendicular or substantially perpendicular to each other, and the height direction is perpendicular to a plane defined by the column direction and the row direction.

The storage array also includes a plurality of semiconductor-structure pairs. Several of the semiconductor-structure pairs are arranged between every two adjacent stacking strip structures 110. The every two adjacent stacking strip structures 110 and the several of the semiconductor-structure pairs arranged therebetween are involved in forming a row storage subarray 120. The conductive strips 111 in the two adjacent stacking strip structures 110 serve as controlling gates of the row storage subarray 120. Each row storage subarray 120 includes a plurality of storage-cell groups 121 distributed along the row direction. Each storage-cell group 121 includes a corresponding semiconductor-structure pair and a base-electrode structure 1212. Each semiconductor-structure pair includes two semiconductor structures 1211 arranged side by side and spaced apart from each other in the column direction. The base-electrode structure 1212 is arranged between the two semiconductor structures 1211. The semiconductor structure 1211 and the base-electrode structure 1212 extend along the height direction respectively.

As shown in FIG. 7, in some embodiments, each row storage subarray 120 is formed with a participation of two adjacent stacking strip structures 110. That is, each row storage subarray 120 corresponds to two stacking strip structures 110, and accordingly, each storage-cell group 121 in each row storage subarray 120 corresponds to two stacking strip structures 110. It should be noted that the "two stacking strip structures 110 corresponding to each storage-cell group 121" mentioned in the present disclosure refers to two adjacent stacking strip structures 110 arranged at both sides of the corresponding storage-cell group 121.

In the column direction, the stacking strip structure 110 arranged at a first side of each storage-cell group 121 serves as a first stacking strip structure corresponding to the corresponding storage-cell group 121. The stacking strip structure 110 arranged at a second side of each storage-cell group 121 serves as a second stacking strip structure corresponding to the corresponding storage-cell group 121. The first side and the second side refer to two opposite sides in the column direction, such as an upper side and a lower side shown in FIG. 7.

For example, as shown in FIG. 7, each storage-cell group 121 in the row storage subarray 120b is arranged between the stacking strip structure 110a and the stacking strip structure 110b. In the column direction Y, the stacking strip structure 110a arranged at the first side (i.e., the upper side shown in FIG. 7) of each storage-cell group 121 in the row storage subarray 120b serves as the first stacking strip structure. The stacking strip structure 110b arranged at the second side (i.e., the lower side shown in FIG. 7) of each storage-cell group 121 in the row storage subarray 120b serves as the second stacking strip structure.

Therefore, each of the stacking strip structures 110 at the non-edge area (that is, any one of the stacking strip structures 110, other than a first one and a last one of the stacking strip structures 110 in the column direction) serves as the second stacking strip structure with respect to the storage-cell groups 121 arranged at the first side (that is, the upper side shown in FIG. 7) thereof, and serves as the first stacking strip structure with respect to the storage-cell groups 121 arranged at the second side (that is, the lower side shown in FIG. 7) thereof.

For example, as shown in FIG. 7, the stacking strip structures 110a serves as the second stacking strip structure with respect to each storage-cell group 121 in the row storage subarray 120a, and serves as the first stacking strip structure with respect to each storage-cell group 121 in the row storage subarray 120b. The stacking strip structure 110b serves the second stacking strip structure with respect to each storage-cell group 121 in the row storage subarray 120b, and serves as the first stacking strip structure with respect to each storage-cell group 121 in the row storage subarray 120c.

In the two stacking strip structures 110 corresponding to each storage-cell group 121, each conductive strip 111 serves as a controlling gate of the corresponding storage-cell group 121, to form a storage cell (bit) 130. Each conductive strip 111 in the first stacking strip structure corresponding to the corresponding storage-cell group 121 serves as a first controlling gate of the corresponding storage-cell group 121, to form a first storage cell 131. Each conductive strip 111 in the second stacking strip structure corresponding to the corresponding storage-cell group 121 serves as a second controlling gate of the corresponding storage-cell group 121, to form a second storage cell 132.

For example, as shown in FIG. 7, the stacking strip structure 110a serves as the first stacking strip structure corresponding to each storage-cell group 121 in the row storage subarray 120b. The stacking strip structure 110b serves as the second stacking strip structure corresponding to each storage-cell group 121 in the row storage subarray 120b. Each conductive strip 111 in the stacking strip structure 110a serves as the first controlling gate of each storage-cell group 121 in the row storage subarray 120b, to form the first storage cell 131. Each conductive strip 111 in the stacking strip structure 110b serves as the second controlling gate of each storage-cell group 121 in the row storage subarray 120b, to form the second storage cell 132.

Therefore, each conductive strip 111 in each of the stacking strip structures 110 at the non-edge area not only serves as the second controlling gate of each storage-cell group 121 in a previous row storage subarray 120, to form the second storage cell 132, but also serves as the first controlling gate of each storage-cell group 121 in a next row storage subarray 120, to form the first storage cell 131.

Each first storage cell 131 matches at least part of a corresponding conductive strip 111 in the first stacking strip structure, at least part of the base-electrode structure 1212, and at least part of a corresponding semiconductor structure 1211. Each second storage cell 132 matches at least part of a corresponding conductive strip 111 in the second stacking strip structure, at least part of the base-electrode structure 1212, and at least part of a corresponding semiconductor structure 1211.

Each of the stacking strip structures 110 at the non-edge area corresponds to two row storage subarrays 120. That is, each of the stacking strip structures 110 at the non-edge area is involved in forming two adjacent row storage subarrays 120. Each conductive strip 111 in each of the stacking strip structures 110 at the non-edge area not only serves as the first controlling gate of each storage-cell group 121 in one of the two row storage subarrays 120, to form the first storage cell 131, but also serves as the second controlling gate of each storage-cell group 121 in the other of the two row storage subarrays 120, to form the second storage cell 132.

In some embodiments, in case that the number of the stacking strip structures 110 in the storage block 100 is recorded as N, other than a first one and a Nth one of the stacking strip structures 110, each stacking strip structure 110 corresponds to two row storage subarrays 120, and each conductive strip 111 therein serves as the second controlling gate of each storage-cell group 121 in the previous row storage subarray 120, to form the second storage cell 132, and as the first controlling gate of each storage-cell group 121 in the next row storage subarray 120, to form a first storage cell 131. Each of the first one and the Nth one of the stacking strip structures 110 corresponds to one row storage subarray 120. The first one of the stacking strip structures 110 is configured to form the first storage cell 131. The Nth one of the stacking strip structures 110 is configured to form the second storage cell 132.

Therefore, other than the first one and the Nth one of the stacking strip structures 110, each conductive strip 111 in each of the remaining stacking strip structures 110 corresponds to two row storage subarrays 120, serves as the second controlling gate of the previous row storage subarray 120, to form a row of the second storage cells 132, and serves as the first controlling gate of the next row storage subarray 120, to form a row of the first storage cells 131.

As for the first one and the Nth one of the stacking strip structures 110, each conductive strip therein corresponds to one row storage subarray 120. Each conductive strip 111 in the first one of the stacking strip structures 110 is configured to form a row of the first storage cells 131. Each conductive strip 111 in the Nth one of the stacking strip structures 110 is configured to form a row of the second storage cells 132.

For example, in case that the number of the stacking strip structures 110 in the storage block 100 is recorded as N, the number of the row storage subarrays 120 may be recorded as N−1, and the storage block 100 includes N−1 rows of the storage-cell groups 121. Furthermore, the number of the storage-cell groups 121 in each row storage subarray 120 is the same as each other, which is recorded as M, the storage block 100 includes M column of storage-cell groups 121. That is, the storage block 100 includes (N−1)*M storage-cell groups 121 in total. In case that the number of the conductive strips 111 in each stacking strip structure 110 is further recorded as L, each storage-cell group 121 includes 2 L storage cells 130. In this way, the storage block 100 includes (N−1)*M*2 L storage cells 130 in total. Herein, the N, M, and L are positive integers.

Figure 16:
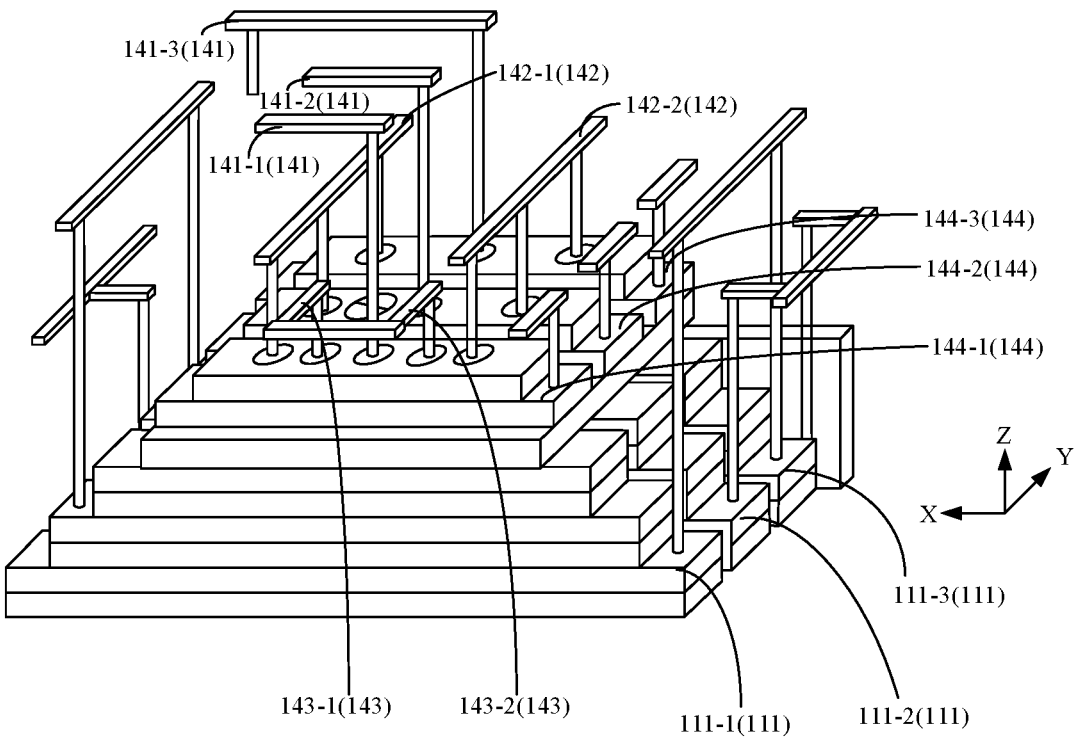
FIG. 16 is a further schematic partial-structure view of the embodiment shown in FIG. 15.

The storage block 100 may be configured to apply voltages to a selected storage cell 130 via various types of the connecting lines (such as the source lines 141, the bit lines 142, the base-electrode lines 143, and so on shown in FIG. 16), and execute different types of storage operations, such as at least one of the reading operation, the programming operation, and the erasing operation.

The storage array and various types of the connecting lines included in the storage block 100 will be described in detail in the following.

The row storage subarrays 120 included in the storage array may be evenly or substantially evenly distributed at predetermined intervals in the column direction. It should be noted that although only three row storage subarrays (120a, 120b, and 120c) are shown in FIG. 7, FIG. 7 is only a schematic partial-structure view of a storage block according to an embodiment of the present disclosure. The present disclosure does not limit the number of the row storage subarrays 120.

As shown in FIG. 7, the stacking strip structures 110 included in the storage array may be evenly or substantially evenly distributed at predetermined intervals in the column direction. It should be noted that although only two stacking strip structures (110a and 110b) are shown in FIG. 7, FIG. 7 is only a schematic partial-structure view of a storage block according to an embodiment of the present disclosure. The present disclosure does not limit the number of the stacking strip structures 110.

Each stacking strip structure 110 includes a plurality of conductive strips 111 and a plurality of insulative strips 112 alternately stacked one by one in the height direction. For example, in case that the conductive strip 111 is recorded as A and the insulative strip 112 is recorded as B, each stacking strip structure 110 may be arranged in a way of BABA A, which is not limited in the present disclosure, and those skilled in the art may make choices according to actual needs. In the height direction, the conductive strips 111 with same distances from the substrate are located on a same layer.

In FIG. 7, each stacking strip structure 110 includes three conductive strips (111a, 111b, and 111c) and three insulative strips 112. That is, the storage block 100 includes three layers of conductive strips in total. It should be noted that FIG. 7 is only a schematic partial-structure view of a storage block according to an embodiment of the present disclosure. The present disclosure does not limit the number of the conductive strips 111 and the number of the insulative strips 112 in each stacking strip structure 110, only if the conductive strip 111 and the insulative strip are alternately arranged one by one.

The conductive strip 111 may be metals (such as copper, aluminum, tungsten, or an alloy thereof), doped or undoped semiconductor materials (such as polycrystalline silicon/ germanium, or other suitable materials). In the height direction, a thickness of the conductive strip 111 may be between 40 nm and 160 nm. For example, the thickness of the conductive strip 111 may be 40 nm, 60 nm, 80 nm, 100 nm, 120 nm, 140 nm, and 160 nm. The insulative strip 112 may be dielectric materials, such as silicon oxide, silicon nitride, silicon oxynitride, and so on. As shown in FIG. 7, in some embodiments, each row storage subarray 120 may include one or more storage-cell groups 121 and an insulative structure 122. The one or more storage-cell groups 121 include a plurality of storage-cell groups 121 distributed along the row direction. An internal space is formed in each storage-cell group 121. The insulative structure 122 includes a first insulative structure 1221 arranged in the internal space of each storage-cell group 121, and a second insulative structure 1222 arranged between any two adjacent storage-cell groups 121.

It should be noted that although each row storage subarray 120 in FIG. 7 only includes four storage-cell groups 121, FIG. 7 is only a schematic partial-structure view of a storage block according to an embodiment of the present disclosure, and the present disclosure does not limit the number of the storage-cell groups 121 in each row storage subarray 120.

As shown in FIG. 7, in some embodiments, the storage-cell groups 121 in two adjacent row storage subarrays 120 are aligned with each other. For example, three row storage subarrays 120 are shown in FIG. 7, each row storage subarray 120 includes four storage-cell groups 121, thereby forming four columns of the storage-cell groups 121. The storage-cell groups 121 located in the same column is aligned with each other.

Figure 8:
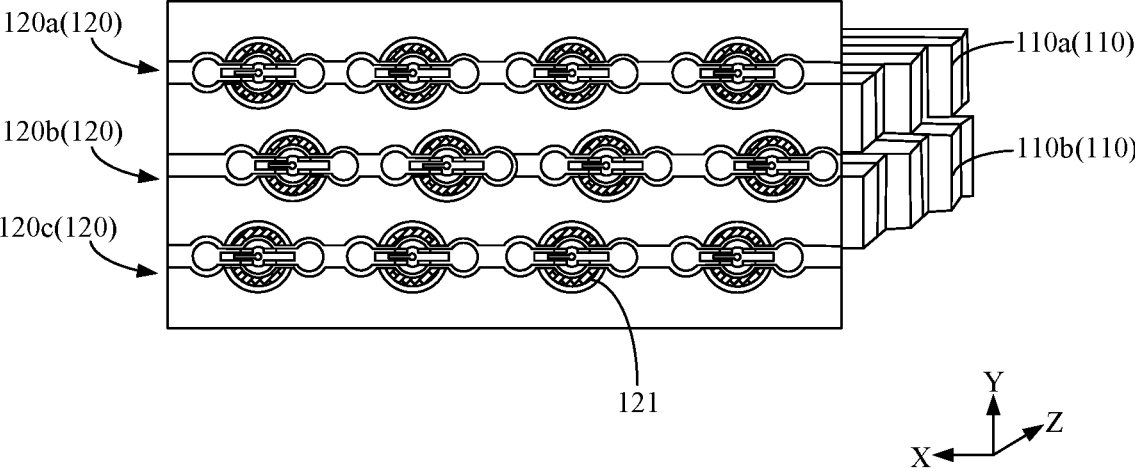
FIG. 8 is a schematic partial-structure view of the storage block according to a further embodiment of the present disclosure.

In some embodiments, the storage-cell groups 121 in two adjacent row storage subarrays 120 are misaligned with each other. As shown in FIG. 8, FIG. 8 is a schematic partial-structure view of the storage block according to a further embodiment of the present disclosure. In FIG. 8, the X direction is the row direction, the Y direction is the column direction, and the Z direction is the height direction. In the first and third rows, the storage-cell groups 121 located in the same column are aligned with each other. In the first and second rows, the storage-cell groups 121 located in the same column are misaligned with each other. In the second and third rows, the storage-cell group 121 located in the same column are misaligned with each other. The misalignment of the storage-cell groups 121 may reduce an electrical interference between adjacent storage structures.

Figure 10:
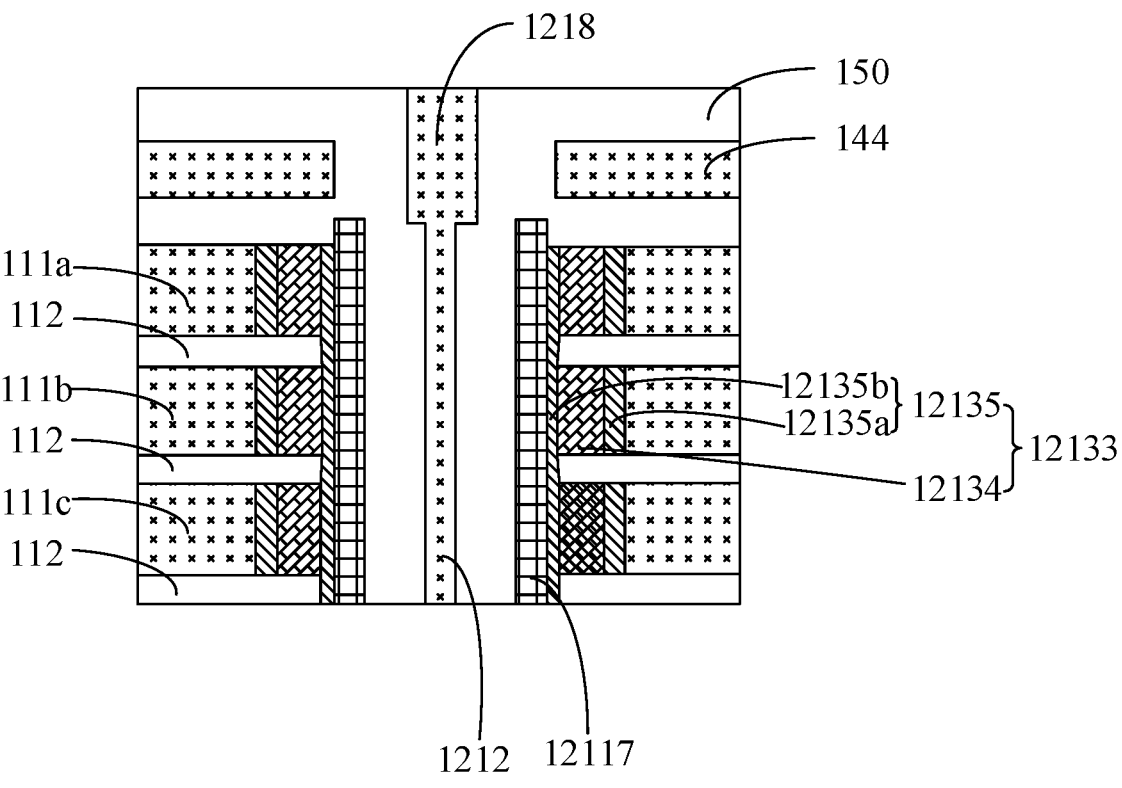
FIG. 10 is a schematic sectional-structure view of the storage-cell group along C-C shown in FIG. 9.
Figure 11:
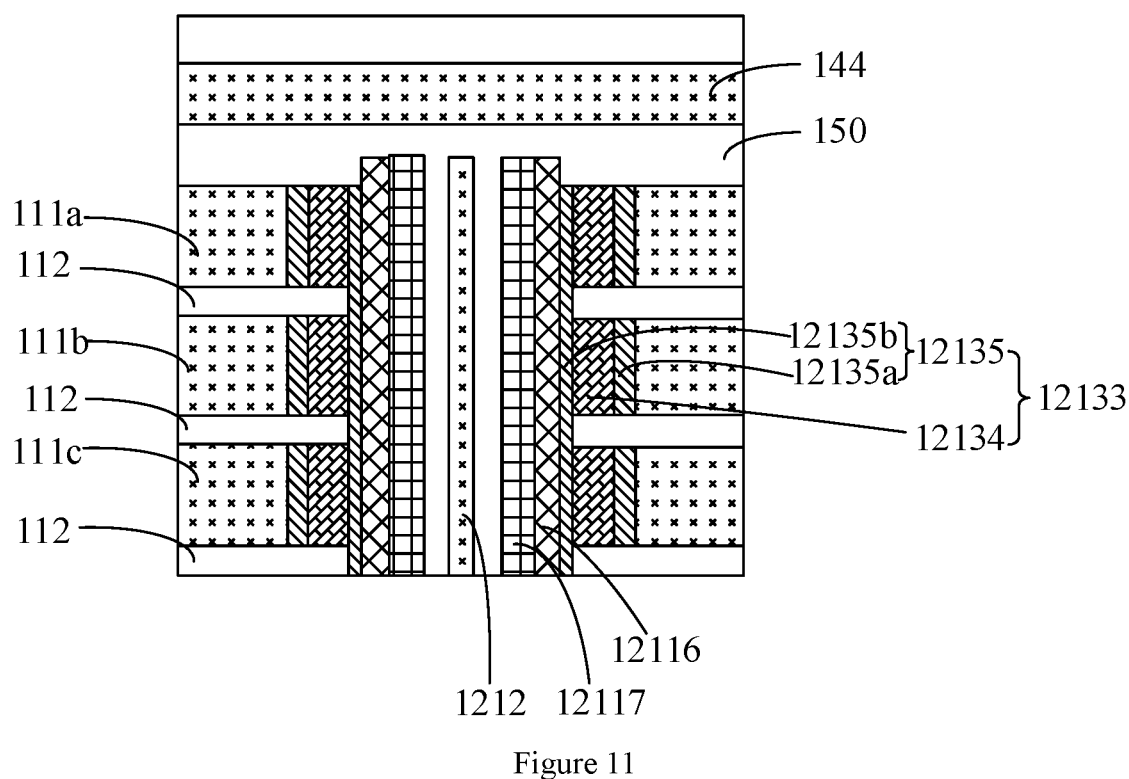
FIG. 11 is a schematic sectional-structure view of the storage-cell group along D-D shown in FIG. 9.
Figure 12:
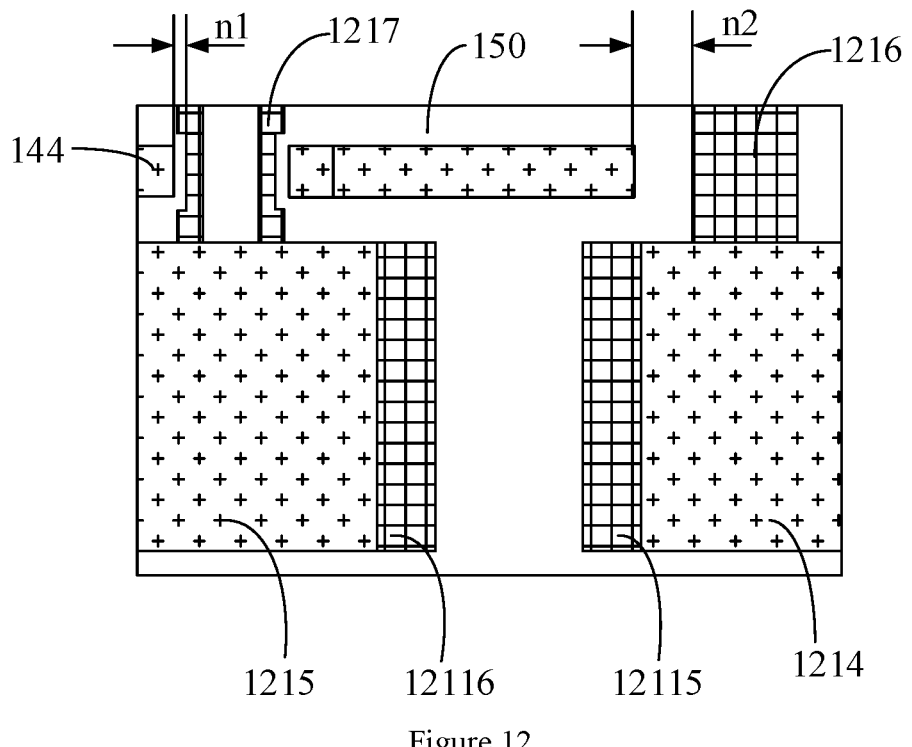
FIG. 12 is a schematic sectional-structure view of the storage-cell group along E-E shown in FIG. 9.
Figure 13:
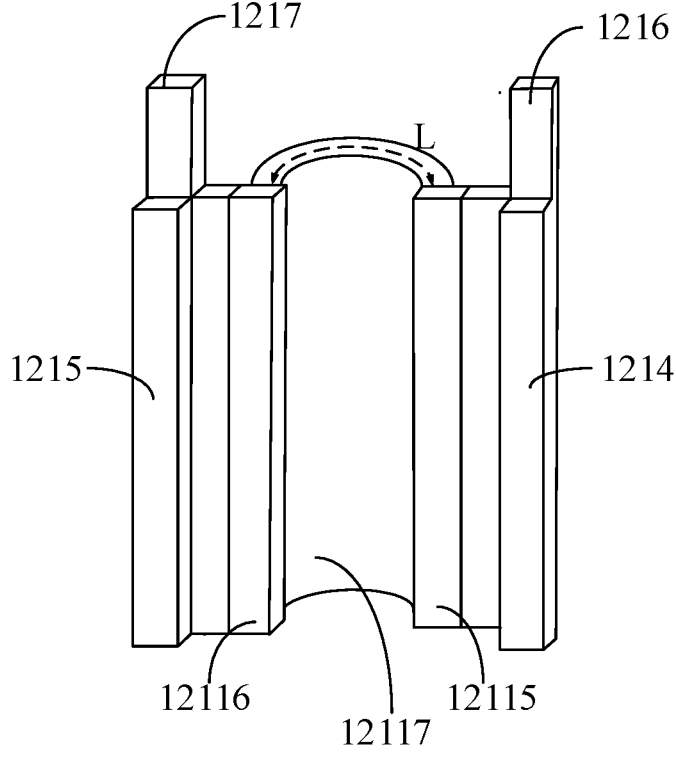
FIG. 13 is a schematic partial-structure view of the storage-cell group in FIG. 7.

One storage-cell group 121 in the storage block 100 will be described in detail in the following. The remaining storage-cell groups 121 in the storage block 100 may be the same as or substantially the same as the one storage-cell group 121, which will not be repeated herein. As shown in FIGS. 7, and 9 to 13, FIG. 9 is a schematic sectional-structure view of a storage-cell group in FIG. 7 on a plane perpendicular to a height direction. FIG. 10 is a schematic sectional-structure view of the storage-cell group along C-C (C-C represents a plane perpendicular to the row direction) shown in FIG. 9. FIG. 11 is a schematic sectional-structure view of the storage-cell group along D-D (D-D represents another plane perpendicular to the row direction) shown in FIG. 9. FIG. 12 is a schematic sectional-structure view of the storage-cell group along E-E (E-E represents a plane perpendicular to the column direction) shown in FIG. 9. FIG. 13 is a schematic partial-structure view of the storage-cell group in FIG. 7.

As shown in FIG. 7, the storage-cell group 121 may include semiconductor structures 1211, a base-electrode structure 1212, and storage structures 1213. The number of the semiconductor structures is two. The two semiconductor structures 1211 extend along the height direction respectively. The two semiconductor structures 1211 are arranged side by side and spaced apart from each other in the column direction. In some embodiments, on a plane perpendicular to the height direction, at least part of a cross section of the semiconductor structure 1211 is arranged in an arc shape, and the two semiconductor structures 1211 are bent in directions away from each other.

Figure 9:
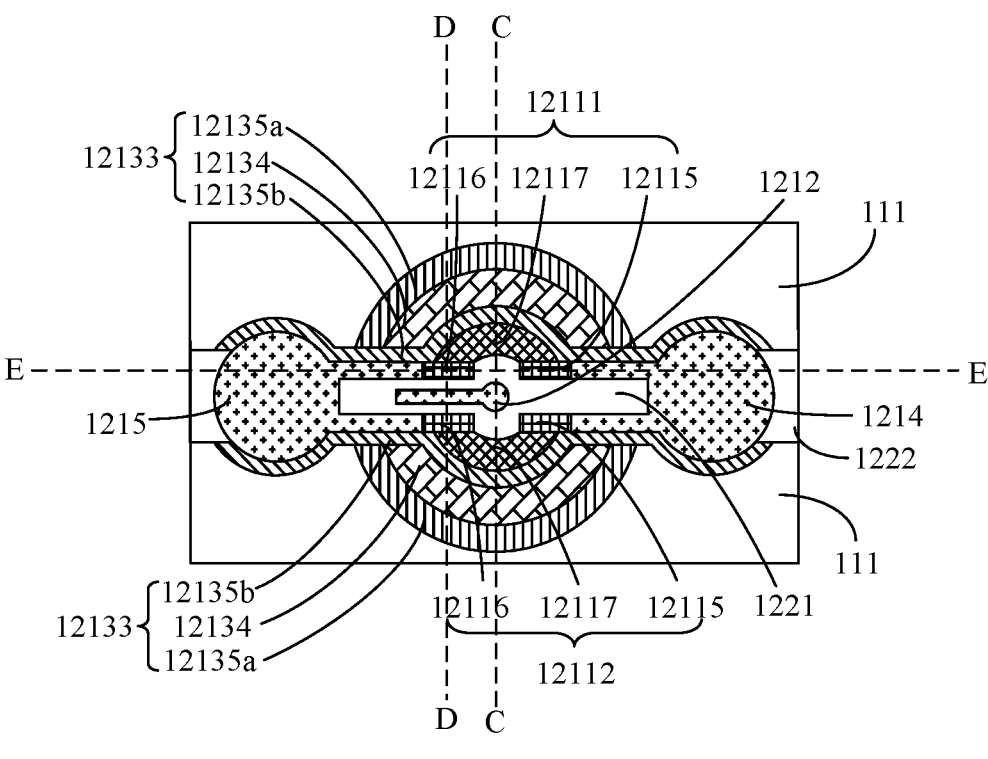
FIG. 9 is a schematic sectional-structure view of a storage-cell group in FIG. 7 on a plane perpendicular to a height direction.

As shown in FIGS. 7 and 9, among the two semiconductor structures 1211 included in the storage-cell group 121, the semiconductor structure 1211 close to the first stacking strip structure corresponding to the storage-cell group 121 serves as a first semiconductor structure 12111, and the semiconductor structure close to the second stacking strip structure corresponding to the storage-cell group 121 serves as a second semiconductor structure 12112. That is, the first stacking strip structure corresponding to the storage-cell group 121 is arranged at one side of the storage-cell group 121 close to the first semiconductor structure 12111, and the second stacking strip structure corresponding to the storage-cell group 121 is arranged at the other side of the storage-cell group 121 close to the second semiconducting structure 12112.

The base-electrode structure 1212 is arranged between the first semiconductor structure 12111 and the second semiconductor structure 12112, and extends in the height direction. The number of the storage structures 1213 may be two. The two storage structures extend in the height direction respectively. Each storage structure 1213 is arranged between a corresponding semiconductor structure 1211 and a corresponding stacking strip structure 110. The storage structure 1213 arranged between the first semiconductor structure 12111 and the first stacking strip structure may serve as a first storage structure 12131. The storage structure 1213 arranged between the second semiconductor structure 12112 and the second stacking strip structure may serve as a second storage structure 12132.

As shown in FIGS. 9 and 13, each of the first semiconductor structure 12111 and the second semiconductor structure 12112 includes a source-region semiconductor structure 12115, a drain-region semiconductor structure 12116, and a channel semiconductor structure 12117 arranged between the source-region semiconductor structure 12115 and the drain-region semiconductor structure 12116.

In the first semiconductor structure 12111, the source-region semiconductor structure 12115, the drain-region semiconductor structure 12116, and the channel semiconductor structure 12117 extend in the height direction respectively. The source-region semiconductor structure 12115 and the drain-region semiconductor structure 12116 are spaced apart from each other along the row direction. The channel semiconductor structure 12117 is arranged at the first side (that is, the upper side shown in FIG. 9) of the source-region semiconductor structure 12115 and the drain-region semiconductor structure 12116, and connected to the source-region semiconductor structure 12115 and the drain-region semiconductor structure 12116 respectively. In some embodiments, on a cross section perpendicular to the height direction, the cross section of the channel semiconductor structure 12117 is arranged in an arc shape, and bent toward the first side. In some embodiments, on the cross section perpendicular to the height direction, the cross section of the channel semiconductor structure 12117 may also be arranged in a bending-line shape, which is not limited in the present disclosure, and those skilled in the art may make choices according to actual needs.

Furthermore, on the cross section perpendicular to the height direction, a length L of the channel semiconductor structure 12117 (the length L is marked in FIG. 13) may be between 100 nm and 300 nm. For example, the length L may be 100 nm, 120 nm, 140 nm, 170 nm, 200 nm, 250 nm, and 300 nm, and those skilled in the art may make choices according to actual needs.

In the second semiconductor structure 12112, the source-region semiconductor structure 12115, the drain-region semiconductor structure 12116, and the channel semiconductor structure 12117 extend in the height direction respectively. The source-region semiconductor structure 12115 and the drain-region semiconductor structure 12116 are spaced apart from each other along the row direction. The channel semiconductor structure 12117 is arranged at the second side (that is, the lower side shown in FIG. 9) of the source-region semiconductor structure 12115 and the drain-region semiconductor structure 12116, and connected to the source-region semiconductor structure 12115 and the drain-region semiconductor structure 12116 respectively. In some embodiments, on the cross section perpendicular to the height direction, the cross section of the channel semiconductor structure 12117 is arranged in an arc shape, and bent toward the second side. In some embodiments, on the cross section perpendicular to the height direction, the cross section of the channel semiconductor structure 12117 may also be arranged in a bending-line shape, which is not limited in the present disclosure, and those skilled in the art may make choices according to actual needs.

Furthermore, on the cross section perpendicular to the height direction, the length L of the channel semiconductor structure 12117 may be between 100-300 nm. For example, the length L may be 100 nm, 120 nm, 140 nm, 170 nm, 200 nm, 250 nm, and 300 nm, and those skilled in the art may make choices according to actual needs.

As shown in FIG. 9, in the storage-cell group 121, source-region semiconductor structures 12115 of the first semiconductor structure 12111 and the second semiconductor structure 12112 are arranged side by side and spaced apart from each other in the column direction. Drain-region semiconductor structures 12116 of the first semiconductor structure 12111 and the second semiconductor structure 12112 are arranged side by side and spaced apart from each other in the column direction. On the plane perpendicular to the height direction, cross sections of channel semiconductor structures 12117 of the first semiconductor structure 12111 and the second semiconductor structure 12112 are respectively arranged in arc shapes and bent in directions away from each other.

In the same semiconductor structure 1211, the source-region semiconductor structure 12115 and the drain-region semiconductor structure 12116 are semiconductor structures of a first doping type, and the channel semiconductor structures 12117 are semiconductor structures of a second doping type 1211. In some embodiment, the source-region semiconductor structure 12115 and the drain-region semiconductor structure 12116 may be N-type doped polycrystalline silicon, and the channel semiconductor structure 12117 may be P-type doped polycrystalline silicon. In some embodiments, the source-region semiconductor structure 12115 and the drain-region semiconductor structure 12116 may be P-type doped polycrystalline silicon, and the channel semiconductor structure 12117 may be N-type doped polycrystalline silicon, which is not limited in the present disclosure, and those skilled in the art may make choices according to actual needs.

In the present disclosure, on the plane perpendicular to the height direction, the cross section of the channel semiconductor structure 12117 is arc-shaped, the length of the channel (i.e., the length L of the channel semiconductor structure 12117 on the cross section perpendicular to the height direction, which is marked in FIG. 13) is increased, thereby improving the performance of a device. In addition, in some embodiments, the channel semiconductor structure 12117 may also be in other shapes, such as a bending-line shape, and so on.

As shown in FIG. 9, in the storage-cell group 121, projections of the base-electrode structure 1212 and the drain-region semiconductor structure 12116 of the first semiconductor structure 12111 on the plane perpendicular to the column direction are overlapped, and projections of the base-electrode structure 1212 and the drain-region semiconductor structure 12116 of the second semiconductor structure 12112 on the plane perpendicular to the column direction are overlapped. The base-electrode structure 1212 may be arranged between the drain-region semiconductor structures 12116 of the first semiconductor structure 12111 and the second semiconductor structure 12112. It should be noted that, in the absence of special instructions, the "overlapped" described in the present disclosure refers to "at least partially overlapped".

In some embodiments, projections of the base-electrode structure 1212 and the source-region semiconductor structure 12115 of the first semiconductor structure 12111 on the plane perpendicular to the column direction are overlapped, and projections of the base-electrode structure 1212 and the source-region semiconductor structure 12115 of the second semiconductor structure 12112 on the plane perpendicular to the column direction are overlapped. The base-electrode structure 1212 may be arranged between the source-region semiconductor structures 12115 of the first semiconductor structure 12111 and of the second semiconductor structure 12112.

In the embodiments described above, the storage-cell group 121 only includes one base-electrode structure 1212. In some embodiments, the storage-cell group 121 may also include two base-electrode structures 1212. One of the two base-electrode structures 1212 is arranged between the drain-region semiconductor structures 12116 of the first semiconductor structure 12111 and the second semiconductor structure 12112. The other of the two base-electrode structures 1212 is arranged between the source-region semiconductor structures 12115 of the first semiconductor structure 12111 and the second semiconductor structure 12112, which is not limited in the present disclosure, and those skilled in the art may make choices according to actual needs.

The base-electrode structure 1212 may be conductive materials such as metals (such as copper, aluminum, tungsten, or an alloy thereof), doped or undoped semiconductor materials (such as polycrystalline silicon/germanium, or other suitable materials), which is not limited in the present disclosure, and those skilled in the art may make choices according to actual needs.

As shown in FIGS. 7 and 9, the first storage structure 12131 may be arranged in an arc shape, that is, on the plane perpendicular to the height direction, the cross section of the first storage structure 12131 may be arranged in an arc shape. In some embodiments, on the plane perpendicular to the height direction, the cross section of the first storage structure 12131 may also be arranged in a bending-line shape, which is not limited in the present disclosure, and those skilled in the art may make choices according to actual needs.

The first storage structure 12131 is arranged between the first stacking strip structure and the source-region semiconductor structure 12115, the drain-region semiconductor structure 12116, and the channel semiconductor structure 12117 in the first semiconductor structure 12111. A bending direction of the first storage structure 12131 is consistent with a bending direction of the channel semiconductor structure 12117 in the first semiconductor structure 12111. As shown in FIG. 7, in the column direction, the first storage structure 12131 may be bent toward the first side (i.e., the upper side shown in FIG. 7).

The second storage structure 12132 may arranged in an arc shape, that is, on the plane perpendicular to the height direction, the cross section of the second storage structure 12132 may be arranged in an arc shape. In some embodiments, on the plane perpendicular to the height direction, the cross section of the second storage structure 12132 may also be arranged in a bending-line shape, which is not limited in the present disclosure, and those skilled in the art may make choices according to actual needs.

The second storage structure 12132 is arranged between the second stacking strip structure and the source-region semiconductor structure 12115, the drain-region semiconductor structure 12116, and the channel semiconductor structure 12117 in the second semiconductor structure 12112. A bending direction of the second storage structure 12132 is consistent with a bending direction of the channel semiconductor structure 12117 in the second semiconductor structure 12112. As shown in FIG. 7, in the column direction, the second storage structure 12132 may be bent toward the second side (i.e., the lower side shown in FIG. 7).

As shown in FIGS. 10 and 11, in some embodiments, each of the first storage structure 12131 and the second storage structure 12132 may include a plurality of floating-gate storage structures 12133 distributed along the height direction. Specifically, each floating-gate storage structure 12133 is involved in forming one storage cell 130. Therefore, the number of the floating-gate storage structures 12133 in the first storage structure 12131 may be the same as the number of the conductive strips 111 in the first stacking strip structure. The number of the floating-gate storage structures 12133 in the second storage structure 12132 may be the same as the number of the conductive strips 111 in the second stacking strip structure.

As shown in FIG. 7, each conductive strip 111 in the first stacking strip structure and the second stacking strip structure serves as the controlling gate of the storage-cell group 121, to form the storage cell 130. Each conductive strip 111 in the first stacking strip structure serves as the first controlling gate of the storage-cell group 121, to form the first storage cell 131.

As shown in FIG. 9, each first storage cell 131 matches at least part of a corresponding conductive strip 111 in the first stacking strip structure, at least part of the source-region semiconductor structure 12115, the drain-region semiconductor structure 12116, and the channel semiconductor structure 12117 in the first semiconductor structure 12111, at least part of the base-electrode structure 1212, and one floating-gate storage structure 12133 in the first storage structure 12131.

In the first storage cell 131, the conductive strip 111 serves as the controlling gate, and the base-electrode structure 1212 serves as the base electrode. Projections of the controlling gate and the channel semiconductor structure 12117 on a projection plane are overlapped, and the projection plane is perpendicular to the column direction. The floating-gate storage structure 12133 is arranged between the controlling gate and the channel semiconductor structure 12117. It should be noted that, in the absence of special instructions, the "overlapped" described in the present disclosure refers to "at least partially overlapped".

Similarly, each second storage cell 132 includes at least part of a corresponding conductive strip 111 in the second stacking strip structure, at least part of the source-region semiconductor structure 12115, the drain-region semiconductor structure 12116, and the channel semiconductor structure 12117 in the second semiconductor structure 12112, at least part of the base-electrode structure 1212, and one floating-gate storage structure 12133 in the second storage structure 12132.

In the second storage cell 132, the conductive strip 111 serves as the controlling gate, and the base-electrode structure 1212 serves as the base electrode. Projections of the controlling gate and the channel semiconductor structure 12117 on the projection plane are overlapped, and the projection plane is perpendicular to the column direction. The floating-gate storage structure 12133 is arranged between the controlling gate and the channel semiconductor structure 12117. It should be noted that, in the absence of special instructions, the "overlapped" described in the present disclosure refers to "at least partially overlapped".

For example, in case that the number of the conductive strips 111 in each stacking strip structure 110 is recorded as L, the conductive strips 111 in the first stacking strip structure 110 serve as the first controlling gates of the storage-cell group 121, and are involved in forming L first storage cells 131. Each first storage cell 131 includes one floating-gate storage structure 12133. That is, the first storage structure 12131 includes L floating-gate storage structures 12133 distributed along the height direction. The conductive strips 111 in the second stacking strip structure serve as the second controlling gate of the storage-cell group 121, and are involved in forming L second storage cells 132. Each second storage cell 132 includes one floating-gate storage structure 12133. That is, the second storage structure 12132 includes L floating-gate storage structures distributed along the height direction.

As shown in FIGS. 10 and 11, the floating-gate storage structure 12133 includes a floating-gate structure 12134 and a dielectric structure 12135 wrapping the floating-gate structure 12134. In each storage cell 130, the floating-gate storage structure 12133 is arranged between the conductive strip 111 and the channel semiconductor structure 12117. The floating-gate structure 12134 serves as a gate, and any surface of the floating-gate structure 12134 is coated by the dielectric structure 12135.

As shown in FIGS. 10 to 11, since the floating-gate structure 12134 is wrapped by the dielectric structure 12135, the floating-gate structures 12134 in the first storage structure 12131 and the second storage structure 12132 are spaced apart from each other. That is, in the storage-cell group 121, different floating-gate structures in different storage cells 130 are spaced apart from each other. The floating-gate structure 12134 may be doped polycrystalline silicon, which is not limited in the present disclosure, and those skilled in the art may make choices according to actual needs.

The floating-gate storage structure 12133, which using polycrystalline silicon as the material of the floating-gate structure 12134, is characterized in that injected charges may not only move in an injection/removal direction, but also move arbitrarily in the floating-gate structure 12134. In the storage block 100 adopting the floating-gate storage structure 12133, in case that the floating-gate structure 12134 is a continuous whole structure, the charges may move arbitrarily along an extending direction of the floating-gate structure 12134. That is, the charges may move between the storage cells 130, and the storage operations for one specific storage cell 130 cannot be realized. Therefore, for the storage block 100 adopting the floating-gate storage structure 12133, the adjacent floating-gate structures 12134 should be independent of each other, so as to reduce a possibility of the charges moving between the adjacent storage cells 130. In this way, the storage operations for one specific storage cell 130 may be realized.

As shown in FIGS. 9 to 11, the dielectric structure 12135 wrapping the floating-gate structure 12134 may include a first dielectric structure 12135a (the first dielectric structure 12135a serves as a first gate-oxide layer) arranged between the floating-gate structure 12134 and the conductive strip 111, a second dielectric structure 12135b (the second dielectric structure 12135b serves as the second gate-oxide layer) arranged between the floating-gate structure 12134 and the source-region semiconductor structure 12115, the drain-region semiconductor structure 12116, and the channel semiconductor structure 12117, and the insulative strip 112 configured to isolate two adjacent floating-gate structures 12134 in the height direction. The first dielectric structure 12135a, the floating-gate structure 12134 and the second dielectric structure 12135b are sequentially stacked. The first dielectric structure 12135a and the second dielectric structure 12135b may be dielectric materials, such as silicon oxide, silicon nitride, silicon oxynitride, etc., which is not limited in the present disclosure, and those skilled in the art may make choices according to actual needs.

As shown in FIGS. 9 and 13, the storage-cell group 121 may further include a source structure 1214 (in some embodiments, the source structure 1214 may also be referred to as a source end) and a drain structure 1215 (in some embodiments, the drain structure 1215 may also be referred to as a drain end). The source structure 1214 and the drain structure 1215 extend along the height direction respectively. The source structure 1214 is arranged at one side of the first semiconductor structure 12111 and the second semiconductor structure 12112 in the row direction (such as a right side shown in FIG. 9), and the drain structure 1215 is arranged at the other side of the first semiconductor structure 12111 and the second semiconductor structure 12112 in the row direction (such as a left side shown in FIG. 9).

The source structure 1214, the first semiconductor structure 12111, the second semiconductor structure 12112 and the drain structure 1215 may be enclosed to form a closed internal space, and the base-electrode structure 1212 may be located in the internal space. A first insulative structure 1221 is arranged in the internal space. As shown in FIG. 9, the base-electrode structure 1212 is separated from the source structure 1214, the first semiconductor structure 12111, the second semiconductor structure 12112, and the drain structure 1215 by the first insulative structure 1221.

The source structure 1214 is connected to the source-region semiconductor structure 12115 of the first semiconductor structure 12111, and the source-region semiconductor structure 12115 of the second semiconductor structure 12112. The source structure 1214 may be conductive materials such as metals (such as copper, aluminum, tungsten, or an alloy thereof), doped or undoped semiconductor materials (such as polycrystalline silicon/germanium, or other suitable materials), which is not limited in the present disclosure, and those skilled in the art may make choices according to actual needs.

The drain structure 1215 is connected to the drain-region semiconductor structure 12116 of the first semiconductor structure 12111, and the drain-region semiconductor structure 12116 of the second semiconductor structure 12112. The drain structure 1215 may be conductive materials such as metals (such as copper, aluminum, tungsten, or an alloy thereof), doped or undoped semiconductor materials (such as polycrystalline silicon/germanium, or other suitable materials), which is not limited in the present disclosure, and those skilled in the art may make choices according to actual needs.

The source structure 1214 is separated from the corresponding first stacking strip structure and the corresponding second stacking strip structure by an insulation material (i.e., a part of the second dielectric structure 12135b extending to the left side as shown in FIG. 9). The drain structure 1215 is separated from the corresponding first stacking strip structure and the corresponding second stacking strip structure by the insulation material (i.e., a part of the second dielectric structure 12135b extending to the right side).

Figure 14:
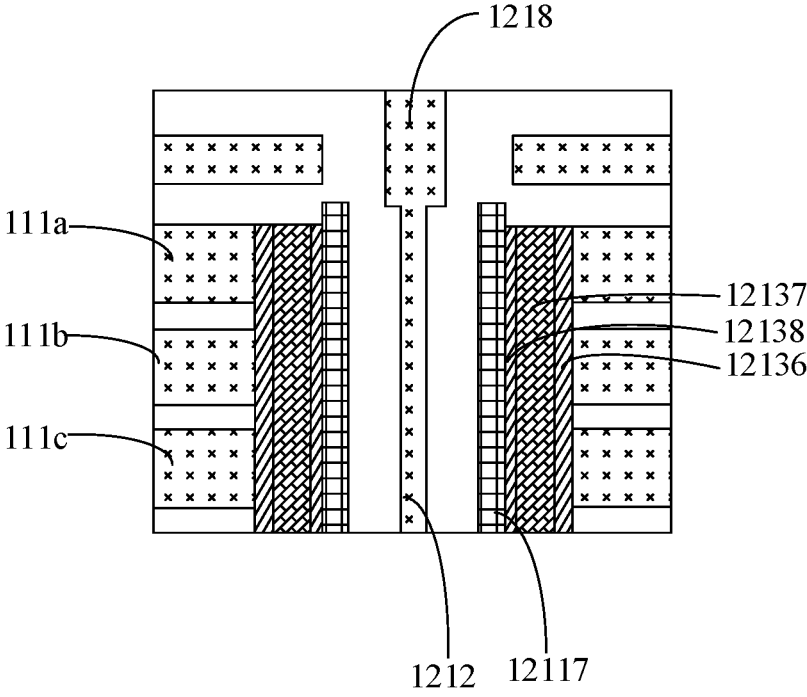
FIG. 14 is a schematic sectional-structure view of the storage-cell group of the storage block along D-D according to a further embodiment of the present disclosure.

As shown in FIG. 14, FIG. 14 is a schematic sectional-structure view of the storage-cell group of the storage block along D-D (D-D represents a plane perpendicular to the row direction) according to a further embodiment of the present disclosure. In some embodiments, the first storage structure 12131 and the second storage structure 12132 may be charge-trapping storage structures respectively, and extend along the height direction respectively.

In some embodiments, the charge-trapping storage structure includes a first dielectric structure 12136, a charge-storage structure 12137, and a second dielectric structure 12138. The first dielectric structure 12136, the charge-storage structure 12137, and the second dielectric structure 12138 extend in the height direction respectively. For the first storage structure 12131, the first dielectric structure 12136 is arranged between the charge-storage structure 12137 and the first stacking strip structure. The charge-storage structure 12137 is arranged between the first dielectric structure 12136 and the second dielectric structure 12138. The second dielectric structure 12138 is arranged between the charge-storage structure 12137 and the source-region semiconductor structure 12115, the drain-region semiconductor structure 12116, and the channel semiconductor structure 12117. In other words, the first dielectric structure 12136, the charge-storage structure 12137, and the second dielectric structure 12138 are sequentially stacked.

For the second storage structure 12132, the first dielectric structure 12136 is arranged between the charge-storage structure 12137 and the second stacking strip structure. The charge-storage structure 12137 is arranged between the first dielectric structure 12136 and the second dielectric structure 12138. The second dielectric structure 12138 is arranged between the charge-storage structure 12137 and the source-region semiconductor structure 12115, the drain-region semiconductor structure 12116, and the channel semiconductor structure 12117. In other words, the first dielectric structure 12136, the charge-storage structure 12137, and the second dielectric structure 12138 are sequentially stacked.

In some embodiments, each first storage cell 131 matches at least part of the corresponding conductive strip 111 in the first stacking strip structure, at least part of the source-region semiconductor structure 12115, the drain-region semiconductor structure 12116, and the channel semiconductor structure 12117 in the first semiconductor structure 12111, at least part of the base-electrode structure 1212, and at least part of the first storage structure 12131. At least part of the corresponding conductive strip 111 in the first stacking strip structure serves as the controlling gate of the first storage cell 131.

In the first storage cell 131, the conductive strip 111 serves as the controlling gate, and the base-electrode structure 1212 serves as the base electrode. Projections of the controlling gate and the channel semiconductor structure 12117 on the projection plane are overlapped, and the projection plane is perpendicular to the column direction. The first storage structure 12131 is arranged between the controlling gate and the channel semiconductor structure 12117. It should be noted that, in the absence of special instructions, the "overlapped" described in the present disclosure refers to "at least partially overlapped".

Each second storage cell 132 matches at least part of the corresponding conductive strip 111 in the second stacking strip structure, at least part of the source-region semiconductor structure 12115, the drain-region semiconductor structure 12116, and the channel semiconductor structure 12117 in the second semiconductor structure 12112, at least part of the base-electrode structure 1212, and at least part of the second storage structure 12132. At least part of the corresponding conductive strip 111 in the second stacking strip structure serves as the controlling gate of the second storage cell 132.

In the second storage cell 132, the conductive strip 111 serves as the controlling gate, and the base-electrode structure 1212 serves as the base electrode. Projections of the controlling gate and the channel semiconductor structure 12117 on the projection plane are overlapped, and the projection plane is perpendicular to the column direction. The second storage structure 12132 is arranged between the controlling gate and the channel semiconductor structure 12117. It should be noted that, in the absence of special instructions, the "overlapped" described in the present disclosure refers to "at least partially overlapped".

The charge-storage structure 12137 may be storage materials with charge-trapping characteristics. For example, the charge-storage structure 12137 may be silicon nitride, which is not limited in the present disclosure, and those skilled in the art may make choices according to actual needs.

A difference between the charge-trapping storage structure and the floating-gate storage structure 12133 is that, injected charges are fixed close to an injection point and may only move in the injection/removal direction, that is, the storage charges may only be fixed close to the injection point and cannot move arbitrarily in the charge-storage structure 12137. In particular, the storage charges cannot move in the extending direction (i.e., the height direction) of the charge-storage structure 12137. Therefore, even if the charge-storage structure 12137 is arranged from top to bottom in the height direction, the charges will not move between the storage cells 130.

The first dielectric structure 12136 and the second dielectric structure 12138 in the charge-trapping storage structure may be dielectric materials, such as silicon oxide, silicon oxynitride, etc., which is not limited in the present disclosure, and those skilled in the art may make choices according to actual needs.

In some embodiments, the first storage structure 12131 and the second storage structure 12132 may also be other types of capacitive dielectric structures, which is not limited in the present disclosure, and those skilled in the art may make choices according to actual needs.

The storage-cell group 121 is described in detail above. As aforementioned, each row storage subarray 120 may include the storage-cell groups 121 and the insulative structures 122. The insulative structures 122 will be described in detail in the following.

As shown in FIGS. 7 and 9, the insulative structures 122 include a first insulative structure 1221 and a second insulative structure 1222. The first insulative structure 1221 and the second insulative structure 1222 may be dielectric materials, such as silicon oxide, silicon nitride, silicon oxynitride, etc., which is not limited in the present disclosure, and those skilled in the art may make choices according to actual needs.

In the embodiment shown in FIG. 7, the second insulative structure 1222 is arranged between any two adjacent storage-cell groups 121. That is, the second insulative structure 1222 is arranged between the source structure 1214 in each storage-cell group 121 and the drain structure 1215 in another adjacent storage-cell group 121, or between the drain structure 1215 in each storage-cell group 121 and the source structure 1214 in another adjacent storage-cell group 121.

Figure 15:
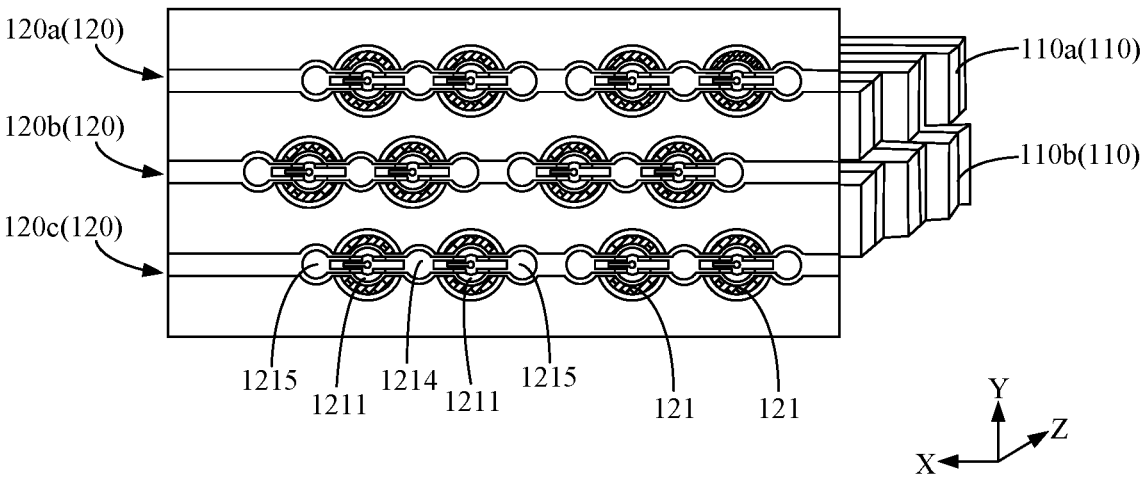
FIG. 15 is a schematic partial-structure view of the storage block according to a further embodiment of the present disclosure.

As shown in FIG. 15, FIG. 15 is a schematic partial-structure view of the storage block according to a further embodiment of the present disclosure. In FIG. 15, the X direction is the row direction, the Y direction is the column direction, and the Z direction is the height direction. Two adjacent storage-cell groups 121 may share the same source structure 1214. As shown in FIG. 15, in the row direction, every two adjacent storage-cell group 121 include the drain structure 1215, the semiconductor structures 1211, the source structure 1214, the semiconductor structures 1211, and the drain structure 1215, to share the same source structure 1214. The second insulative structure 1222 is arranged between the drain structure 1215 in every two adjacent storage-cell groups 121 and the drain structure 1215 in another two adjacent storage-cell groups 121 adjacent to the every two adjacent storage-cell groups 121.

It should be noted that the embodiment described in FIG. 15 is different from the embodiment described in FIG. 7 only in that two adjacent storage-cell groups 121 share the source structure in the row direction. Other features in the two embodiments may be the same or similar as each other. For example, the arranging methods of various types of the connecting lines in FIG. 16 described below may also be applied to the embodiment shown in FIG. 7.

The storage array in the storage block 100 has been described above in detail. Various types of the connecting lines included in the storage block 100 will be described in the following.

As shown in FIG. 16, FIG. 16 is a further schematic partial-structure view of the embodiment shown in FIG. 15. Various types of the connection lines included in the storage block 100 include the word lines, the source lines 141, the bit lines 142, and the base-electrode lines 143.

As shown in FIGS. 15 and 16, each conductive strip 111 in each stacking strip structure 110 may serve as one word line. That is, the word line extends along the row direction. For example, in case that the number of the conductive strips 111 in each stacking strip structure 110 is recorded as L, and the number of the stacking strip structures 110 in the storage block 100 is recorded as N, the storage block 100 includes L*N conductive strips 111 in total. Each conductive strip 111 may serve as one word line, that is, the storage block 100 includes L*N word lines in total. Odd numbered ones of the conductive strips 111 in the same layer (such as 111-1 and 111-3 shown in FIG. 16) are connected together. Even numbered ones of the conductive strips 111 in the same layer (such as 111-2 shown in FIG. 16) are connected together.

As shown in FIGS. 10 and 13, the storage-cell group 121 further includes a source connecting column 1216 connected to the source structure 1214 in the height direction and extending in the height direction, a drain connecting column 1217 connected to the drain structure 1215 in the height direction and extending in the height direction, and a base-electrode connecting column 1218 connected to the base-electrode structure 1212 in the height direction and extending in the height direction.

As shown in FIG. 12, the source connecting column 1216 may be a solid-column structure, and the material of the source connecting column 1216 may the same as or similar to the material of the source-region semiconductor structure 12115. The drain connecting column 1217 may be a hollow-column structure with an insulating material arranged therein. In some embodiments, the drain connecting column 1217 may also be a solid-column structure, which is not limited in the present disclosure, and those skilled in the art may make choices according to actual needs. The material of the drain connecting column 1217 may be the same as or similar to the material of the drain-region semiconductor structure 12116. The material of the base-electrode connecting column 1218 may be the same as or similar to the base-electrode structure 1212.

As shown in FIGS. 13, 15 and 16, the source structures 1214 of a plurality of storage-cell groups 121 in the same row are connected to the same source line 141 through the corresponding source connecting columns 1216. That is, the source line 141 extends along the row direction. In case that the number of the stacking strip structures 110 in the storage block 100 is recorded as N, the number of the row storage subarrays 120 may be N−1. Each row of the storage-cell groups 121 corresponds to one source line 141. The storage block 100 includes N−1 source lines 141 in total.

It should be noted that although only three source lines 141 (141-1, 141-2, and 141-3) are shown in FIG. 16, FIG. 16 is only a schematic partial-structure view of the storage block according to an embodiment of the present disclosure. The present disclosure does not limit the number of the source lines 141, and those skilled in the art may make choices according to actual needs.

As shown in FIGS. 13, 15 and 16, the drain structures 1215 of a plurality of storage-cell groups 121 in the same column are connected to the same bit line 142 through the corresponding drain connecting columns 1217. That is, the bit line 142 extends along the column direction. For example, in case that the number of the storage-cell groups 121 in each row storage subarray 120 is recorded as M, the storage block 100 includes M columns of the storage-cell groups 121 in total. Each column of the storage-cell groups 121 corresponds to one bit line 142, and the storage block 100 includes M bit lines 142 in total.

It should be noted that although only two bit lines 142 (142-1 and 142-2) are shown in FIG. 16, FIG. 16 is only a schematic partial-structure view of the storage block according to an embodiment of the present disclosure. The present disclosure does not limit the number of the bit lines 142, and those skilled in the art may make choices according to actual needs.

As shown in FIGS. 9 and 16, the base-electrode structure 1212 of the storage-cell groups 121 in the same column are connected to the same base-electrode line 143 through the corresponding base-electrode connecting columns 1218. For example, in case that the number of the storage-cell groups 121 in each row storage subarray 120 is recorded as M, the storage block 100 includes M columns of the storage-cell groups 121 in total. Each column of the storage-cell groups 121 corresponds to one base-electrode line 143, and the storage block 100 includes M base-electrode lines 143 in total.

All the base-electrode lines 143 of the storage block 100 may be connected together. It should be noted that although only two base-electrode lines 143 (143-1 and 143-2) are shown in FIG. 16, FIG. 16 is only a schematic partial-structure view of the storage block 100 according to an embodiment of the present disclosure. The present disclosure does not limit the number of base-electrode lines 143, and those skilled in the art may make choices according to actual needs.

As shown in FIGS. 12 and 16, the storage block 100 may further include an insulative dielectric layer 150 arranged at one side (i.e., the upper side in FIGS. 12 and 16) of the storage array in the height direction. A plurality of drain controlling strips 144 spaced apart from each other along the column direction are arranged in the insulative dielectric layer 150. In some embodiments, each row storage subarray 120 corresponds to one drain controlling strip 144, and each drain controlling strip 144 extends along the row direction. For example, in case that the number of stacking strip structures 110 in the storage block 100 is recorded as N, the number of the row storage subarrays 120 may be N−1. Each row storage subarray 120 corresponds to one drain controlling strip 144, and the storage block 100 includes N−1 drain controlling strips 144 in total.

The drain controlling strip 144 may be metals (such as copper, aluminum, tungsten, or an alloy thereof). In each row storage subarray 120, the source connecting column 1216 and drain connecting column 1217 of each storage-cell group 121 pass through the insulative dielectric layer 150 and the corresponding drain controlling strip 144. An insulative-material in the insulative dielectric layer 150 is arranged between the drain connecting column 1217 and the corresponding drain controlling strip 144, and between the source connecting column 1216 and the corresponding drain controlling strip 144. In the direction perpendicular to the height direction, a thickness n1 (The thickness n1 is marked in FIG. 12) of the insulativematerial between the drain connecting column 1217 and the corresponding drain controlling strip 144 is less than a thickness n2 (The thickness n2 is marked in FIG. 12) of the insulativematerial between the source connecting column 1216 and the corresponding drain controlling strip 144.

For each storage-cell group 121, since the drain connecting column 1217 in the embodiment is a hollow structure, in case that a drain controlling voltage which is higher than the corresponding bit-line voltage (that is, the voltage of the bit line 142 connected to the storage-cell group 121) is applied to the drain controlling strip 144 corresponding to the storage-cell group 121, the drain connecting column 1217 in the storage-cell group 121 is relatively easy to be inverted, and the drain connecting column 1217 is in a turn-on state. In case that the voltage applied to the drain controlling strip 144 is lower than the corresponding bit-line voltage, the drain connecting column 1217 in the storage-cell group 121 is in a turn-off state.

It should be noted that although only three drain controlling strips 144 (144-1, 144-2, and 144-3) are shown in FIG. 16, FIG. 16 is only a schematic partial-structure view of the storage block according to an embodiment of the present disclosure. The present disclosure does not limit the number of the drain controlling strips 144, and those skilled in the art may make choices according to actual needs.

In the present disclosure, each row storage subarray 120 corresponds to one drain controlling strip. The source connecting column 1216 and the drain connecting column 1217 of each storage-cell group 121 in the row storage subarray 120 pass through the insulative dielectric layer 150 and the corresponding drain controlling strip 144. The insulativematerial in the insulative dielectric layer 150 is arranged between the drain connecting column 1217 and the corresponding drain controlling strip 144, and between the source connecting column 1216 and the corresponding drain controlling strip 144. The thickness n1 of the insulativematerial between the drain connecting column 1217 and the corresponding drain controlling strip 144 is less than the thickness n2 of the insulative material between the source connecting column 1216 and the corresponding drain controlling strip 144. In this way, it is possible to control the conducting state of the drain connecting column 1217 in each storage-cell group 121 according to actual needs, such that the reading operation for one specific storage cell 130 (read by bit), the programming operation for one specific storage cell 130 (PGM by bit), and the erasing operation for one specific storage cell 130 (erase by bit) of the storage block 100 may be realized.

The way of the storage block 100 executing the reading operation, the programming operation, and the erasing operation for one specific storage cell 130 will be described in detail in the following.

In case that the storage block 100 needs to select one storage cell 130 to execute the read operation (for the convenience of description, the selected storage cell 130 may be recorded as a target cell), the storage block 100 may be configured to select all the odd or even numbered ones of the conductive strips 111 in one layer (that is, a half of the conductive strips 111 in one layer is selected) to apply a first word-line selecting voltage and execute a layer selection. Through the layer selection, the layer in which the target cell is located may be selected. The first word-line selecting voltage may be a positive voltage, such as 5V. The remaining unselected conductive strips 111 may be connected to 0V.

The storage block 100 may also be configured to select one bit line 142 (such as 142-1) to apply a first bit-line selecting voltage and execute a column selection. Through the column selection, the column in which the target cell is located may be selected. The first bit-line selecting voltage may be a positive voltage, such as 1V. The remaining unselected bit lines 142 (such as 142-2) may be floating. The storage block 100 may also be configured to select one source line 141 (such as 141-2) to apply a first source selecting voltage and executed a row selection. Through the row selection, the row in which the target cell is located may be selected. The first source selecting voltage may be 0V. The remaining unselected source lines 141 (such as 141-1 and 141-3) may be floating.

The storage block 100 may also be configured to select one drain controlling strip 144 (such as 144-2) to apply a drain controlling voltage (such as 2V, which is higher than the first bit-line selecting voltage of 1V). The remaining drain controlling strips 144 (such as 144-1 and 144-3) may be connected to 0V, which is lower than the first bit-line selecting voltage of 1V, such that the target cell may be selected to execute the reading operation in coordination with the layer selection, the column selection, and the row selection. The selected drain controlling strip 144 and the selected source line 141 are connected to the same row of the storage-cell groups 121.

In addition, in response to the reading operation being executed on the target cell, all base-electrode lines 143 may be floating. As shown in FIG. 2, in case that electrons are stored in the floating-gate structure 12134 of the target cell, a threshold voltage of the target cell rises. The conductive strip 111 serves as the controlling gate, and receives the first word-line selecting voltage of 5V. The first word-line selecting voltage is not enough to conduct the target cell. That is, no conductive channel exists between the source-region semiconductor structure 12115 and the drain-region semiconductor structure 12116. Therefore, no current is generated between the source-region semiconductor structure 12115 and the drain-region semiconductor structure 12116, and "0" is read.

As shown in FIG. 3, in case that no electron is stored in the floating-gate structure 12134 of the target cell, and the conductive strip 111 serves as the controlling gate and receives the first word-line selecting voltage of 5V, the first word-line selecting voltage is enough to conduct the target cell. That is, the conductive channel exists between the source-region semiconductor structure 12115 and the drain-region semiconductor structure 12116. A current is generated between the source-region semiconductor structure 12115 and the drain-region semiconductor structure 12116, and "1" is read.

In case that the storage block 100 needs to select one storage cell 130 (for the convenience of description, the selected storage cell 130 may be recorded as the target cell) to execute the programming operation, the storage block 100 may be configured to select all the odd or even numbered ones of the conductive strips 111 in one layer (that is, a half of the conductive strips 111 in one layer is selected) to apply a second word-line selecting voltage and execute the layer selection. Through the layer selection, the layer in which the target cell is located may be selected. The second word-line selecting voltage may be a positive voltage, such as 10V. The remaining unselected conductive strips 111 may be floating.

The storage block 100 may also be configured to select one bit line 142 (such as 142-1) to apply a second bit-line selecting voltage and execute the column selection. Through the column selection, the column in which the target cell is located may be selected. The second bit-line selecting voltage may be a negative voltage, such as −5V. The remaining unselected bit lines 142 (such as 142-2) may be floating.

The storage block 100 may also be configured to select one drain controlling strip 144 (such as 144-2) to apply the drain controlling voltage (such as 0V, which is higher than the second bit-line selecting voltage of −5V), apply the drain controlling voltage which is lower than the second bit-line selecting voltage of −5V (such as −8V) to the remaining drain controlling strips 144 (such as 144-1 and 144-3), and execute the row selection, to select the row in which the target cell is located. In this way, the target cell may be selected for the programming operation in coordination with the layer selection and the column selection.

In addition, in response to the programming operation being executed on the target cell, the source lines 141 and the base-electrode lines 143 may be floating. As shown in FIG. 4, the drain in the target cell receives the second bit-line selecting voltage of −5V, and the source is floating, such that the electrons flow from the drain-region semiconductor structure 12116 to the source-region semiconductor structure 12115. In a process of flowing from the drain-region semiconductor structure 12116 to the source-region semiconductor structure 12115, the electrons need to pass through under the controlling gate (i.e., the conductive strip 111). Due to a strong positive electric field applied to the controlling gate, some electrons are "pulled" into the floating-gate structure 12134 of the target cell. Once pulled in, these electrons will no longer have the energy required to escape, so that data is programmed in the target cell. That is, the data is programmed in the target cell by hot carrier injection.

In case that the storage block 100 executes the erasing operation, the storage block 100 may be configured to select all the odd or even numbered ones of the conductive strips 111 in one layer (that is, a half of the conductive strips in one layer is selected) to apply a third word-line selecting voltage and execute the layer selection. Through the layer selection, the layer in which the target cell is located may be selected. The third word-line selecting voltage may be a negative voltage, such as −10V. The remaining unselected conductive strips 111 may be floating.

The storage block 100 may also be configured to select one bit line 142 (such as 142-1) to apply a third bit-line selecting voltage and execute the column selection. Through the column selection, the column in which the target cell is located may be selected. The third bit-line selecting voltage may be a positive voltage, such as 5V. The remaining unselected bit lines 142 (such as 142-2) may be floating.

The storage block 100 may also be configured to select one drain controlling strip 144 (such as 144-2) to apply the drain controlling voltage which is higher than the third bit-line selecting voltage (such as 6V, which is higher than the third bit-line selecting voltage of 5V). The remaining drain controlling strips 144 (such as 144-1 and 144-3) may be connected to 0V, which is lower than the third bit-line selecting voltage of 5V), so as to execute the row selection, and the row in which the target cell is located may be selected. In this way, the target cell may be selected for the erasing operation in coordination with the layer selection and the column selection.

In addition, in response to the erasing operation being executed, the base voltage of 0.5V (as aforementioned, the base voltage is lower than the third bit-line selecting voltage of 5V, and much larger than the third word-line selecting voltage of −10V) may be applied to the base-electrode lines 143, and all the source lines 141 may be floating. As shown in FIG. 5, since the base voltage 0.5V is lower than the third bit-line selecting voltage of 5V, a part of the drain-region semiconductor structure 12116 close to the base-electrode structure 1212 is inverted to the P type, another part of the drain-region semiconductor structure 12116 far away from the base-electrode structure 1212 remains to be the N type, thereby forming a PN junction. The band-to-band tunneling will be generated at the PN junction, and electrons and holes are generated. The electrons flow away from the drain electrode. The holes enter the floating-gate structure 12134 under the action of a high electric field to realize the erasing operation.

In some embodiments, the storage block 100 may also be configured to select a half of the storage cells 130 in one storage-cell group 121 to execute the erasing operation.

For example, the storage block 100 may be configured to select all the odd numbered ones of the conductive strips 111 in each layer to apply the third word-line selecting voltage. All the even numbered ones of the conductive strips 111 in each layer may be floating. The storage block 100 may also be configured to select one bit line 142 (such as 142-1) to apply the third bit-line selecting voltage and execute the column selection, so as to select one column. The remaining unselected bit lines 142 (such as 142-2) may be floating. The storage block 100 may also be configured to select one drain controlling strip 144 (such as 144-2) to apply the drain controlling voltage which is higher than the third bit-line selecting voltage. The remaining drain controlling strips 144 (such as 144-1 and 144-3) are connected to 0V, so as to execute the row selection. In this way, a storage-cell group is selected in coordination with the column selection. In this case, by applying the base voltage of 0.5V to all the base-electrode lines, all the storage cells 131 formed with a participation of all the odd numbered ones of the conductive strips in one storage-cell group 121 (i.e., a half of the storage cells 131 in one storage-cell group 121) may be selected to execute the erasing operation.

Similarly, the storage block 100 may be configured to select all the even numbered ones of the conductive strips 111 in each layer to apply the third word-line selecting voltage. All the odd numbered ones of the conductive strip 111 in each layer may be floating. The storage block 100 may also be configured to select one bit line 142 (such as 142-1) to apply the third bit-line selecting voltage and execute the column selection, so as to select one column. The remaining unselected bit lines 142 (such as 142-2) may be floating. The storage block 100 may also be configured to select one drain controlling strip 144 (such as 144-2) to apply the drain controlling voltage which is higher than the third bit-line selecting voltage. The remaining drain controlling strips 144 (such as 144-1 and 144-3) are connected to 0V, so as to execute the row selection. In this way, a storage-cell group is selected in coordination with the column selection. In this case, by applying the base voltage of 0.5V to all the base-electrode lines, all the storage cells 131 formed with a participation of all the even numbered ones of the conductive strips in one storage-cell group 121 (i.e., a half of the storage cells 131 in one storage-cell group 121) may be selected to execute the erasing operation.

It should be noted that, various types of the connecting lines and the storage array included in the storage block 100 may be arranged on the same chip or on two chips respectively. For example, various types of the connecting lines other than the word lines may be arranged on one chip and stacked on another chip in which the storage array is located through a 3D bonding technology. In this way, a connection between various types of the connecting lines and the storage array is realized, which is not limited in the present disclosure, and those skilled in the art may make choices according to actual needs.

In the present disclosure, the storage array includes a plurality of stacking strip structures 110 and a plurality of semiconductor-structure pairs. The semiconductor-structure pairs are spaced apart from each other along a column direction. Each stacking strip structure 110 extends along a row direction, and includes a plurality of insulative strips 112 and a plurality of conductive strips 111 alternately stacked along a height direction. Several of the semiconductor-structure pairs are arranged between every two adjacent stacking strip structures 110. The every two adjacent stacking strip structures 110 and the several of the semiconductor-structure pairs arranged therebetween are involved in forming a row storage subarray 120. The conductive strips 111 in the two adjacent stacking strip structures 110 serve as controlling gates of the row storage subarray 120. The row storage subarray 120 includes a plurality of storage-cell groups 121 distributed along the row direction. Each storage-cell group 121 includes a corresponding semiconductor-structure pair and a base-electrode structure 1212. The corresponding semiconductor-structure pair includes two semiconductor structures 1211 arranged side by side and spaced apart from each other in the column direction. The base-electrode structure 1212 is arranged between two semiconductor structures 1211. Each semiconductor structure 1211 and the base-electrode structure 1212 extend along the height direction respectively. In this way, a three-dimensional stacking structure is provided, and a storage density of the storage block 100 is improved.

In the above description of the present disclosure, unless otherwise specified and limited, the terms "fixed", "installed", "linked", or "connected" should be understood broadly. For example, the term "connected" may be a fixed connection, a detachable connection, or an integrated structure, may be a mechanical connection or an electrical connection, may be a direct connection or an indirect connection through an intermediate media, or may be an internal connection between two components or an interaction between two components. Therefore, unless otherwise explicitly defined in the present disclosure, those skilled in the art may understand the specific meaning of the above terms in the present disclosure according to specific situations.

According to the above description of the present disclosure, those skilled in the art may also understand that the following terms, such as "up", "down", "front", "back", "left", "right", "length", "width", "thickness", "vertical", "horizontal", "top", "bottom", "inside", "outside", "axial", "radial", "circumferential", "center", "longitudinal", "transverse", "clockwise" or "anticlockwise" indicating an orientation or a position relationship are based on the orientation or the position relationship shown in the figures of the present disclosure, which is only for the purpose of explaining the scheme of the present disclosure and simplifying the present disclosure, rather than indicating or implying that the device or element involved must have a specific orientation, and must be configured and operated in the specific orientation, so that the aforementioned terms indicating an orientation or a position relationship cannot be understood or interpreted as a limitation to the scheme of the present disclosure.

In addition, the terms "first" or "second" used in the present disclosure referring to the number or ordinal number are only for description purposes, and cannot be understood as indicating or implying a relative importance or implying the number of the indicated technical features. Therefore, features defined by the "first" or "second" may explicitly or implicitly indicate that at least one such feature is included. In the description of the present disclosure, "a plurality" means at least two, such as two, three or more, unless otherwise specified.

The above is only the implementation modes of the present disclosure, which does not limit the patent scope of the present disclosure. Any equivalent structure or equivalent process transformation made by using the contents of the description and figures of the present disclosure, or directly or indirectly applied in other related technical fields, is similarly included in the patent protecting scope of the present disclosure.

What is claimed is:

1. A storage block, comprising:

a storage array, comprising a plurality of stacking strip structures and a plurality of semiconductor-structure pairs, the stacking strip structures being spaced apart from each other along a column direction; and each of the stacking strip structures extending along a row direction, and comprising a plurality of insulative strips and a plurality of conductive strips alternately stacked along a height direction;

wherein several of the semiconductor-structure pairs are arranged between every two of the stacking strip structures adjacent to each other, the every two of the stacking strip structures adjacent to each other and the several of the semiconductor-structure pairs arranged therebetween are involved in forming a row storage subarray, and the conductive strips in the every two of the stacking strip structures adjacent to each other serve as controlling gates of the row storage subarray; the row storage subarray comprises a plurality of storage-cell groups distributed along the row direction, and each of the storage-cell groups comprises a corresponding one of the semiconductor-structure pairs and a base-electrode structure; each of the semiconductor-structure pairs comprises two semiconductor structures arranged side by side and spaced apart from each other in the column direction, and the base-electrode structure is arranged between the two semiconductor structures; and the two semiconductor structures and the base-electrode structure extend along the height direction respectively.

2. The storage block according to claim 1, wherein each of the two semiconductor structures comprises a source-region semiconductor structure, a drain-region semiconductor structure, and a channel semiconductor structure arranged between the source-region semiconductor structure and the drain-region semiconductor structure; and the source-region semiconductor structure, the drain-region semiconductor structure, and the channel semiconductor structure extend along the height direction respectively.

3. The storage block according to claim 2, wherein in each of the storage-cell groups, source-region semiconductor structures of the two semiconductor structures are arranged side by side and spaced apart from each other in the column direction, and drain-region semiconductor structures of the two semiconductor structures are arranged side by side and spaced apart from each other in the column direction; and projections of the base-electrode structure and the drain-region semiconductor structure of each of the two semiconductor structures on a plane perpendicular to the column direction are overlapped.

4. The storage block according to claim 2, wherein in each of the storage-cell groups, on a plane perpendicular to the height direction, cross sections of channel semiconductor structures of the two semiconductor structures are respectively arranged in arc shapes, and bent in directions away from each other.

5. The storage block according to claim 2, wherein in two of the stacking strip structures corresponding to each of the storage-cell groups, each of the conductive strips serves as a controlling gate of a corresponding one of the storage-cell groups, to form a storage cell; and the storage cell matches at least part of a corresponding one of the conductive strips, at least part of the base-electrode structure, and at least part of the channel semiconductor structure, the source-region semiconductor structure, and the drain-region semiconductor structure in a corresponding one of the two semiconductor structures;

in the column direction, one of the two of the stacking strip structures arranged at a first side of the corresponding one of the storage-cell groups serves as a first stacking strip structure corresponding to the corresponding one of the storage-cell groups, the other of the two of the stacking strip structures arranged at a second side of the corresponding one of the storage-cell groups serves as a second stacking strip structure corresponding to the corresponding one of the storage-cell groups, and the first side is opposite to the second side;

each of the conductive strips in the first stacking strip structure serves as a first controlling gate of the corresponding one of the storage-cell groups, to form a first storage cell; and each of the conductive strips in the second stacking strip structure serves as a second controlling gate of the corresponding one of the storage-cell groups, to form a second storage cell.

6. The storage block according to claim 5, wherein
each of the stacking strip structures at a non-edge area corresponds to two row storage subarrays; each of the conductive strips in each of the stacking strip structures at the non-edge area serves as the first controlling gate of each of the storage-cell groups in one of the two row storage subarrays, to form the first storage cell, and serves as the second controlling gate of each of the storage-cell groups in the other of the two row storage subarrays, to form a second storage cell; and
each of the conductive strips in each of the stacking strip structures serves as a word line.

7. The storage block according to claim 1, wherein
each of the storage-cell groups corresponds to two of the stacking strip structures; and
each of the storage-cell groups further comprises two storage structures, and each of the two storage structures is arranged between a corresponding one of the two semiconductor structures and a corresponding one of the two of the stacking strip structures.

8. The storage block according to claim 7, wherein
the two storage structures are charge-trapping storage structures and extend along the height direction; and
each of the two storage structures comprises a first dielectric structure, a charge-storage structure, and a second dielectric structure, the first dielectric structure is arranged between the charge-storage structure and the corresponding one of the two stacking strip structures, the charge-storage structure is arranged between the first dielectric structure and the second dielectric structure, and the second dielectric structure is arranged between the charge-storage structure and the corresponding one of the two semiconductor structures.

9. The storage block according to claim 7, wherein
each of the two storage structures comprises a plurality of floating-gate storage structures distributed along the height direction, and each of the floating-gate storage structures is involved in forming a storage cell;
each of the floating-gate storage structures comprises a floating-gate structure and a dielectric structure wrapping the floating-gate structure; and in the storage cell, a corresponding one of the floating-gate storage structures is arranged between a corresponding one of the conductive strips and the corresponding one of the two semiconductor structures, and any surface of the floating-gate structure is coated by the dielectric structure.

10. The storage block according to claim 2, wherein
each of the storage-cell groups further comprises a source structure and a drain structure extending along the height direction; and
the source structure is connected to the source-region semiconductor structure of each of the two semiconductor structures, and the drain structure is connected to the drain-region semiconductor structure of each of the two semiconductor structures.

11. The storage block according to claim 10, wherein
each of the storage-cell groups corresponds to two stacking strip structures;
in each of the storage-cell groups, the source structure and each of the two stacking strip structures are separated by an insulation material, and the drain structure and each of the two stacking strip structures are separated by the insulation material.

12. The storage block according to claim 10, wherein
in each of the storage-cell groups, a first insulative structure is arranged in an area enclosed by the source structure, the drain structure and the two semiconductor structures; and
the base-electrode structure is arranged in the area enclosed by the source structure, the drain structure and the two semiconductor structures, and the base-electrode structure is spaced apart from the source structure, the drain structure, and the two semiconductor structures through the first insulative structure.

13. The storage block according to claim 10, wherein
in the row direction, a second insulative structure is arranged between the source/drain structure in each of the storage-cell groups and the source/drain structure in adjacent one of the storage-cell groups; or
in the row direction, every two of the storage-cell groups adjacent to each other comprise the drain structure, the two semiconductor structures, the source structure, the two semiconductor structures, and the drain structure, to share the same source structure; and the second insulative structure is arranged between the drain structure in every two of the storage-cell groups adjacent to each other and the drain structure in another two of the storage-cell groups adjacent to each other, the another two of the storage-cell groups are adjacent to the every two of the storage-cell groups.

* * * * *